(12) United States Patent
Aiba et al.

(10) Patent No.: US 9,076,789 B2
(45) Date of Patent: Jul. 7, 2015

(54) SEMICONDUCTOR DEVICE HAVING A HIGH FREQUENCY EXTERNAL CONNECTION ELECTRODE POSITIONED WITHIN A VIA HOLE

(71) Applicant: FUJITSU SEMICONDUCTOR LIMITED, Yokohama-shi, Kanagawa (JP)

(72) Inventors: Yoshitaka Aiba, Kawasaki (JP); Tetsuya Fujisawa, Kawasaki (JP); Yoshiyuki Yoneda, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/148,202

(22) Filed: Jan. 6, 2014

(65) Prior Publication Data

US 2014/0117562 A1    May 1, 2014

Related U.S. Application Data

(60) Continuation of application No. 13/687,572, filed on Nov. 28, 2012, now abandoned, which is a continuation of application No. 12/076,033, filed on Mar. 13, 2008, now Pat. No. 8,344,490, which is a division of application No. 11/136,563, filed on May 25, 2005, now abandoned.

(30) Foreign Application Priority Data

Feb. 18, 2005   (JP) .................. 2005-042872

(51) Int. Cl.
*H01L 23/02*    (2006.01)
*H01L 23/48*    (2006.01)
(Continued)

(52) U.S. Cl.
CPC ......... *H01L 23/5226* (2013.01); *H01L 23/3128* (2013.01); *H01L 23/49816* (2013.01);
(Continued)

(58) Field of Classification Search
CPC ... H01L 23/481; H01L 25/0657; H01L 24/73; H01L 23/49816; H01L 23/49855; H01L 2225/06541; H01L 24/48; H01L 2224/16145
USPC ......... 257/686, 777, 685, 778, 723, 724, 773, 257/774, 737, 734, 738, 276; 361/764, 761, 361/762
See application file for complete search history.

(56) References Cited

U.S. PATENT DOCUMENTS 5,422,615 A   6/1995  Shibagaki et al.
6,232,660 B1  5/2001  Kakimoto et al.
(Continued)

FOREIGN PATENT DOCUMENTS

JP    6-349973 A    12/1994
JP    11-97582 A    4/1999
(Continued)

OTHER PUBLICATIONS

Taiwanese Office Action dated Feb. 27, 2008, issued in corresponding Taiwanese Application No. 94117027, with English translation.
(Continued)

*Primary Examiner* — Alexander Oscar Williams
(74) *Attorney, Agent, or Firm* — Westerman, Hattori, Daniels & Adrian, LLP

(57) ABSTRACT

A semiconductor device is disclosed that includes a support substrate, a first semiconductor element that is mounted on one side of the support substrate, a second semiconductor element including a high frequency electrode that is mounted on the one side of the support substrate, a via hole that is provided at the support substrate in relation to the high frequency electrode, and an external connection electrode that is provided on the other side of the support substrate in relation to the via hole.

7 Claims, 15 Drawing Sheets

(51) Int. Cl.
  *H01L 23/498* (2006.01)
  *H01L 23/522* (2006.01)
  *H01L 23/538* (2006.01)
  *H01L 23/552* (2006.01)
  *H01L 23/66* (2006.01)
  *H01L 25/18* (2006.01)
  *H01L 23/31* (2006.01)
  *H01L 23/00* (2006.01)

(52) U.S. Cl.
  CPC .......... *H01L23/5384* (2013.01); *H01L 23/552* (2013.01); *H01L 23/66* (2013.01); *H01L 25/18* (2013.01); *H01L 2224/16225* (2013.01); *H01L 2224/32145* (2013.01); *H01L 2224/48091* (2013.01); *H01L 2224/48227* (2013.01); *H01L 2224/48235* (2013.01); *H01L 2924/01004* (2013.01); *H01L 2924/15174* (2013.01); *H01L 2924/15184* (2013.01); *H01L 2924/15311* (2013.01); *H01L 2924/19041* (2013.01); *H01L 2924/30107* (2013.01); *H01L 2924/3011* (2013.01); *H01L 2924/3025* (2013.01); *H01L 23/49827* (2013.01); *H01L 24/48* (2013.01); *H01L 2224/32225* (2013.01); *H01L 2224/73265* (2013.01); *H01L 2924/01019* (2013.01); *H01L 2924/19042* (2013.01); *H01L 2924/19105* (2013.01); *H01L 2224/73253* (2013.01); *H01L 2224/16235* (2013.01)

(56) References Cited

U.S. PATENT DOCUMENTS

| | | | |
|---|---|---|---|
| 6,239,496 B1 * | 5/2001 | Asada | 257/777 |
| 6,403,199 B2 | 6/2002 | Mori et al. | |
| 6,489,676 B2 * | 12/2002 | Taniguchi et al. | 257/698 |
| 6,495,770 B2 | 12/2002 | Li et al. | |
| 6,528,871 B1 | 3/2003 | Tomita | |
| 6,639,299 B2 | 10/2003 | Aoki | |
| 6,664,874 B2 | 12/2003 | Shirasaki | |
| 6,757,178 B2 | 6/2004 | Okabe et al. | |
| 6,759,740 B2 | 7/2004 | Onitani et al. | |
| 6,800,936 B2 | 10/2004 | Kosemura et al. | |
| 6,806,428 B1 | 10/2004 | Kimura et al. | |
| 6,809,688 B2 | 10/2004 | Yamada | |
| 6,847,275 B2 | 1/2005 | Sayanagi et al. | |
| 6,873,529 B2 | 3/2005 | Ikuta et al. | |
| 6,998,710 B2 | 2/2006 | Kobayashi et al. | |
| 7,034,388 B2 * | 4/2006 | Yang et al. | 257/686 |
| 7,098,680 B2 | 8/2006 | Fukushima et al. | |
| 7,109,578 B2 | 9/2006 | Ishida | |
| 7,176,556 B2 | 2/2007 | Okamoto et al. | |
| 7,176,579 B2 | 2/2007 | Konishi et al. | |
| 7,183,135 B2 | 2/2007 | Ogawa et al. | |
| 7,215,033 B2 * | 5/2007 | Lee et al. | 257/777 |
| 7,245,003 B2 * | 7/2007 | Li | 257/660 |
| 7,271,476 B2 | 9/2007 | Nishikawa et al. | |
| 7,274,570 B2 | 9/2007 | Ishizaki | |
| 7,289,008 B2 | 10/2007 | Kuroki et al. | |
| 7,336,221 B2 | 2/2008 | Matsuo et al. | |
| 7,394,027 B2 | 7/2008 | Kaluzni et al. | |
| 7,453,153 B2 * | 11/2008 | Saita et al. | 257/777 |
| 7,518,379 B2 | 4/2009 | Pukushima et al. | |
| 7,521,809 B2 * | 4/2009 | Birzer et al. | 257/777 |
| 7,723,839 B2 * | 5/2010 | Yano et al. | 257/700 |
| 7,791,360 B2 | 9/2010 | Fukushima et al. | |
| 7,847,413 B2 * | 12/2010 | Akiba et al. | 257/777 |
| 7,885,081 B2 * | 2/2011 | Kawagishi et al. | 361/761 |
| 8,067,814 B2 | 11/2011 | Takehara et al. | |
| 8,097,490 B1 * | 1/2012 | Pagaila et al. | 438/106 |
| 8,159,058 B2 * | 4/2012 | Ishikawa et al. | 257/686 |
| 8,264,849 B2 * | 9/2012 | Guzek | 361/764 |
| 8,274,148 B2 * | 9/2012 | Yanase et al. | 257/737 |
| 8,482,134 B1 * | 7/2013 | Darveaux et al. | 257/780 |
| 8,736,065 B2 * | 5/2014 | Gonzalez et al. | 257/774 |
| 8,884,416 B2 * | 11/2014 | Lee et al. | 257/686 |
| 2002/0027018 A1 | 3/2002 | Chikagawa et al. | |
| 2002/0072147 A1 | 6/2002 | Sayanagi et al. | |
| 2003/0043558 A1 | 3/2003 | Shirasaki | |
| 2003/0080400 A1 | 5/2003 | Okamoto et al. | |
| 2003/0080835 A1 | 5/2003 | Hreish et al. | |
| 2003/0122153 A1 | 7/2003 | Suzuki et al. | |
| 2003/0122228 A1 | 7/2003 | Nagase et al. | |
| 2003/0169575 A1 | 9/2003 | Ikuta et al. | |
| 2004/0056341 A1 | 3/2004 | Endo et al. | |
| 2004/0124539 A1 * | 7/2004 | Yang et al. | 257/777 |
| 2004/0125579 A1 * | 7/2004 | Konishi et al. | 361/783 |
| 2004/0174228 A1 | 9/2004 | Kanno | |
| 2004/0238949 A1 * | 12/2004 | Iijima et al. | 257/728 |
| 2004/0245640 A1 | 12/2004 | Tsukamoto et al. | |
| 2004/0251531 A1 * | 12/2004 | Yang et al. | 257/686 |
| 2005/0006745 A1 | 1/2005 | Nishimura | |
| 2005/0051903 A1 * | 3/2005 | Ellsberry et al. | 257/777 |
| 2005/0117312 A1 | 6/2005 | Kimura et al. | |
| 2005/0205982 A1 * | 9/2005 | Kawano | 257/686 |
| 2005/0249462 A1 | 11/2005 | Alduino et al. | |
| 2005/0288392 A1 | 12/2005 | Okubora | |
| 2006/0017157 A1 | 1/2006 | Yamamoto et al. | |
| 2006/0049995 A1 | 3/2006 | Imaoka et al. | |
| 2006/0097382 A1 | 5/2006 | Mori et al. | |
| 2006/0097402 A1 * | 5/2006 | Pu et al. | 257/777 |
| 2006/0097906 A1 | 5/2006 | Heide | |
| 2006/0102374 A1 | 5/2006 | Heide | |
| 2006/0131611 A1 | 6/2006 | Kaluzni et al. | |
| 2006/0180942 A1 * | 8/2006 | Kuroda et al. | 257/777 |
| 2006/0186524 A1 * | 8/2006 | Aiba et al. | 257/686 |
| 2006/0186755 A1 | 8/2006 | Mori et al. | |
| 2007/0065781 A1 | 3/2007 | Okamoto et al. | |
| 2007/0075435 A1 * | 4/2007 | Suminoe et al. | 257/777 |
| 2007/0278657 A1 * | 12/2007 | Lee | 257/692 |
| 2009/0078456 A1 | 3/2009 | Macropoulos et al. | |
| 2011/0068464 A1 * | 3/2011 | Chi et al. | 257/723 |
| 2011/0140247 A1 * | 6/2011 | Pagaila et al. | 257/659 |
| 2014/0061951 A1 * | 3/2014 | Lee | 257/777 |
| 2014/0374894 A1 * | 12/2014 | Chen et al. | 257/686 |

FOREIGN PATENT DOCUMENTS

| | | | |
|---|---|---|---|
| JP | 2001-088097 A | | 4/2001 |
| JP | 2001-284485 A | | 10/2001 |
| JP | 2002-314028 A | | 10/2002 |
| JP | 2003-110084 A | | 4/2003 |
| JP | 2003-318319 A | | 11/2003 |
| JP | 2004-273706 A | | 9/2004 |
| JP | 2004-319605 A | | 11/2004 |
| JP | 2005-019568 A | | 1/2005 |
| JP | 2005-72454 A | | 3/2005 |
| JP | 2005-101367 A | | 4/2005 |
| JP | 2005-216999 A | | 8/2005 |
| JP | 2005-217580 A | | 8/2005 |
| JP | 2006-203652 A | | 8/2006 |
| JP | 2007-258776 A | | 10/2007 |
| TW | 200410385 A | | 6/2004 |

OTHER PUBLICATIONS

Korean Office Action dated Aug. 31, 2006, issued with corresponding Korean Patent Application No. 10-2005-0045506.

Japanese Office Action dated Feb. 26, 2008, issued in corresponding Japanese Application No. 2005-042872.

* cited by examiner

SEMICONDUCTOR DEVICE HAVING A HIGH FREQUENCY EXTERNAL CONNECTION ELECTRODE POSITIONED WITHIN A VIA HOLE

CROSS-REFERENCE TO RELATED APPLICATIONS

This application is a continuation of U.S. application Ser. No. 13/687,572, filed on Nov. 28, 2012, now abandoned, which is a continuation of U.S. application Ser. No. 12/076,033, filed on Mar. 13, 2008, now U. S. Pat. No. 8,344,490 issued Jan. 1, 2013, which is a division of U.S. application Ser. No. 11/136,563, filed on May 25, 2005, now abandoned, which is based upon and claims the benefit of priority from the prior Japanese Patent Application No. 2005-042872, filed on Feb. 18, 2005, the entire contents of which are incorporated herein by reference.

BACKGROUND OF THE INVENTION

1. Field of the Invention

The present invention relates to a semiconductor device in which a semiconductor element such as a memory element and/or a logic element, and a high frequency semiconductor element for handling high frequency signals are mounted on a common substrate.

2. Description of the Related Art

In recent years and continuing, there is a growing demand for higher integration of semiconductor elements such as electronic components in an electronic apparatus such as a mobile phone to realize miniaturization and technical improvements in the electronic apparatus.

In response to such a demand, a semiconductor device has been developed that accommodates plural semiconductor elements with differing functions (e.g., a memory element and/or a logic element such as a microprocessor) within a common container or package. Such a semiconductor device is referred to as a SiP (System in Package).

Also, with respect to the electronic apparatus, increased communication speed is being demanded for communicating with external units and/or apparatuses. Accordingly, a high frequency semiconductor element for handling high frequency signals within a frequency band of 0.1~10 GHz, for example, may be provided within the container or package as is described above.

FIG. 1 is a diagram showing a structure of a mounting substrate accommodating a semiconductor device including semiconductor elements corresponding to a memory element and/or a logic element such as a microprocessor, and a semiconductor device including a high frequency semiconductor element.

In the illustrated example, a first semiconductor device 10 including semiconductor elements 21 and 25 corresponding to a memory element and/or a logic element, for example, and a second semiconductor device 40 including a high frequency semiconductor device 47 are mounted on one side of a motherboard (main electronic circuit substrate of an electronic apparatus) 55.

The first semiconductor device 10 includes a support substrate 11, semiconductor elements 21 and 25 that are mounted on one side of the support substrate 11, and external connection terminals 31 that are provided on the other side of the support substrate 11.

The support substrate 11 corresponds to a semiconductor element mounting substrate that includes via holes (filled with conductive material, but hereinafter referred to as via holes) 13 that penetrate through a base material 12 of the support substrate 11, wire connecting portions 14 and 15 that are provided at the upper ends of the via holes 13, and connection pads 16 and 17 that are provided at the lower ends of the via holes 13.

The semiconductor element 21 is mounted on the support substrate 11, and includes electrode pads 22 that are electrically connected to the wire connecting portions 14 of the support substrate 11 by wires 23.

The semiconductor element 25 is mounted on the support substrate 11, and includes electrode pads 26 that are electrically connected to the wire connecting portions 15 of the support substrate 11 by wires 28. The semiconductor elements 21 and 25 are sealed by resin 29 along with the wires 23 and 28.

The connection pads 16 and 17 are electrically connected to pads 57 or wiring 59 that are provided on the motherboard 55 via the external terminals 31 that are shaped into balls or bumps, for example.

It is noted that in one example, one of the semiconductors 21 and 25 may correspond to a logic element such as a microprocessor and the other one of the semiconductors 21 and 25 may correspond to a memory element such as a flash memory. In this case, the relative positioning of the logic element and the memory element (i.e., which of the semiconductor elements is placed on top of the other) may be determined depending on conditions such as the chip size (area) and the number of terminals required for realizing the functions and circuit configurations of the respective semiconductor elements.

The second semiconductor device 40 includes a support substrate 41, a high frequency semiconductor element 47 that is mounted on one side of the support substrate 41, and external connection terminals 53 that are provided on the other side of the support substrate 41.

The support substrate 41 corresponds to a semiconductor element mounting substrate that includes via holes 43 that penetrate through a base material 42 of the support substrate 41, wire connecting portions 44 that are provided at the upper ends of the via holes 43, and connection pads 45 that are provided at the lower ends of the via holes 43.

The high frequency semiconductor element 47, corresponding to a semiconductor element that is adapted to handle a high frequency analog signal having a frequency above 1 GHz, for example, is mounted on the support substrate 41, and includes electrode pads 48 that are electrically connected to the wire connecting portions 44 of the support substrate 41 by wires 49.

The high frequency semiconductor element 47 is sealed by resin 51 along with the wires 49. The connection pads 45 are connected to pads 58 or the wiring 59 provided on the motherboard 55 via external connection terminals 53 that are shaped into balls or bumps.

The wiring 59 provided on one side of the motherboard 55 realizes electrical connection between the first semiconductor device 10 and the second semiconductor device 40. For example, Japanese Laid-Open Patent Publication No. 2003-110084 discloses a technique relating to an arrangement as is described above.

In order to realize miniaturization and technical improvements in an electronic apparatus such as a mobile phone, a semiconductor element handling a high frequency signal is preferably mounted on a common substrate with a logic element and/or a memory element as is described above, rather than being provided as a separate semiconductor device.

However, as is known to persons skilled in the art, a high frequency semiconductor element is easily influenced by electromagnetic fields of other wiring and semiconductor elements located in the vicinity of the high frequency semiconductor element.

For example, in the example of FIG. 1, if the semiconductor elements 21 and 25 and the high frequency semiconductor element 47 are mounted on the mother board 55 as a common support substrate (interposer) and sealed together (packaged), interference may occur between a signal transmitted through the wiring/wire connected to the high frequency semiconductor element 47 and a signal transmitted through the wiring/wire connected to the semiconductor elements 21 or 25, and desired electric characteristics may not be obtained.

Accordingly, in the prior art, as is shown in FIG. 1, the semiconductor elements 21 and 25 and the high frequency semiconductor element 47 are mounted on the motherboard 55 as separate semiconductor devices 10 and 40, respectively.

However, when more than one sealed (packaged) semiconductor devices are mounted on one common support substrate as is described above, the packaging density of the support substrate may decrease, this being an obstacle to miniaturization of the electronic apparatus.

Also, when plural semiconductor devices other than those corresponding to the high frequency semiconductor element are separately formed on a support substrate and attempts are made to achieve desired electric characteristics for each of the semiconductor devices, the support substrate design may be complicated and the manufacturing cost of the electronic apparatus may be raised.

Further, in the above described structure, the length of the wiring connecting the high frequency semiconductor device to another semiconductor device (e.g., wiring 59 of FIG. 1) may be quite long so that a large transmission loss may be generated upon transmitting a high frequency signal.

SUMMARY OF THE INVENTION

The present invention has been conceived in response to one or more of the problems of the related art, and its object is to provide a semiconductor device with increased packaging density that is capable of preventing transmission loss of a high frequency signal and realizing miniaturization and technical improvements in an electronic apparatus.

In one aspect of the present invention, a first semiconductor element and a second semiconductor element are mounted on a common support substrate so that the packaging density of the semiconductor device may be increased. Also, a high frequency electrode is provided on one side of the support substrate at a position corresponding to the position of a via hole, and an external connection electrode is provided on the other side of the support substrate at a position corresponding to the position of the via hole so that the length of a signal transmission path between the high frequency electrode and the external connection electrode may be reduced and transmission loss of a high frequency signal may be prevented.

In a preferred embodiment of the present invention, the second semiconductor element is mounted face-down on the one side of the support substrate. In one aspect of the present embodiment, the high frequency electrode may be connected to the support substrate.

In another preferred embodiment of the present invention, a center axis of the high frequency electrode positioned within a periphery of the via hole. In one aspect of the present embodiment, the high frequency electrode is arranged such that its center axis is positioned within the periphery of the via hole so that high frequency signal transmission between the high frequency electrode and the external connection electrode may be accurately conducted.

In another preferred embodiment of the present invention, the first semiconductor element is stacked on the second semiconductor element. In one aspect of the present embodiment, the first semiconductor element is stacked on top of the second semiconductor element so that the size of the support substrate may be reduced and miniaturization of the semiconductor device may be realized while preventing the transmission loss of the high frequency signal being transmitted.

In another preferred embodiment of the present invention, the second semiconductor element includes a shield member that is set to ground potential. In one aspect of the present embodiment, a shield member that is set to ground potential is provided at the second semiconductor element so that the second semiconductor element may be protected from being affected by noise from the first semiconductor element.

In another preferred embodiment of the present invention, the second semiconductor element includes rewiring that forms a passive element. In one aspect of the present embodiment, by using the rewiring to form a passive element, a passive element does not have to be separately formed so that the number of components and the mounting space required in the second semiconductor element may be reduced. Also, impedance may be reduced so that the electric characteristics of the second semiconductor element may be improved.

In another preferred embodiment of the present invention, the second semiconductor element includes a pair of re-wiring structures that include portions that are parallel to each other. In one aspect of the present embodiment, by providing a pair of re-wiring structures having portions that are parallel to each other, crosstalk in the wiring may be cancelled so that noise may be reduced.

In another preferred embodiment of the present invention, the second semiconductor element includes a set of re-wiring structures that have substantially equivalent wiring lengths. In one aspect of the present embodiment, by providing a set of re-wiring structures having substantially equivalent wiring lengths, adjustment and optimization of the skew timing may be conducted.

DESCRIPTION OF THE PREFERRED EMBODIMENTS

In the following, preferred embodiments of the present invention are described with reference to the accompanying drawings.

(First Embodiment)

Figure 1:
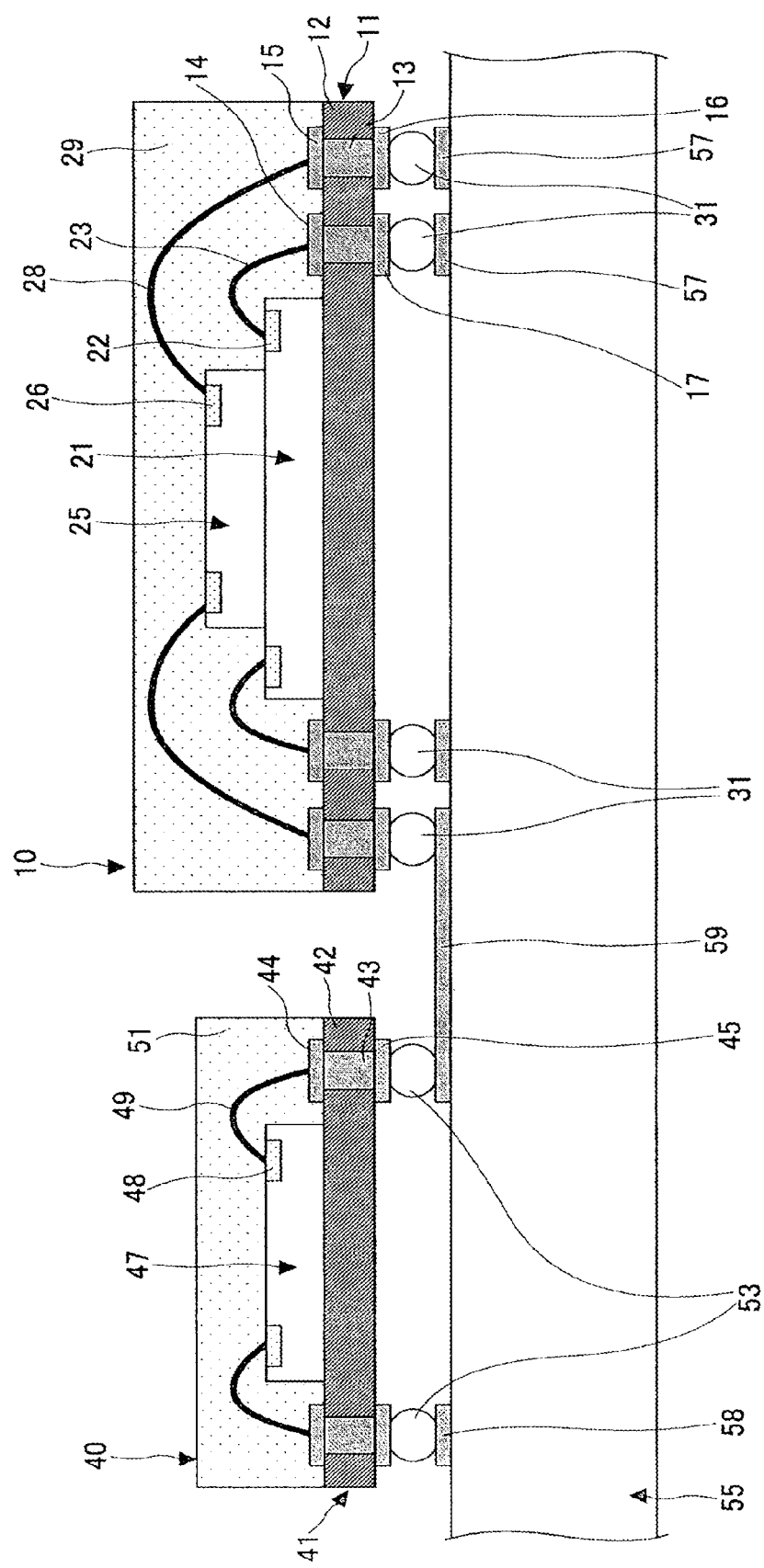
FIG. 1 is a cross-sectional diagram showing a structure of a mounting substrate accommodating plural semiconductor devices according to the prior art.
Figure 2:
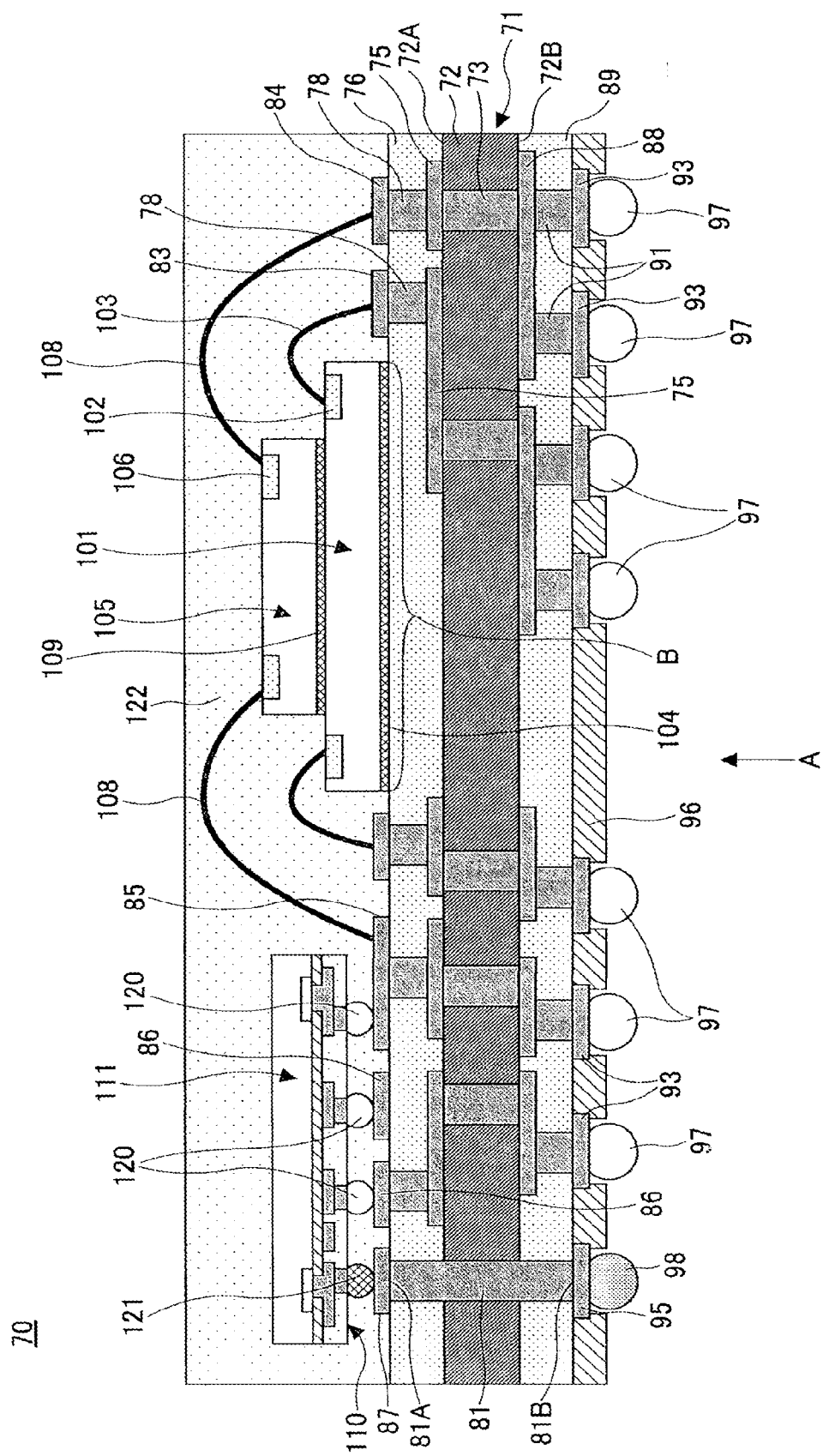
FIG. 2 is a cross-sectional diagram showing a configuration of a semiconductor device according to a first embodiment of the present invention.
Figure 3:
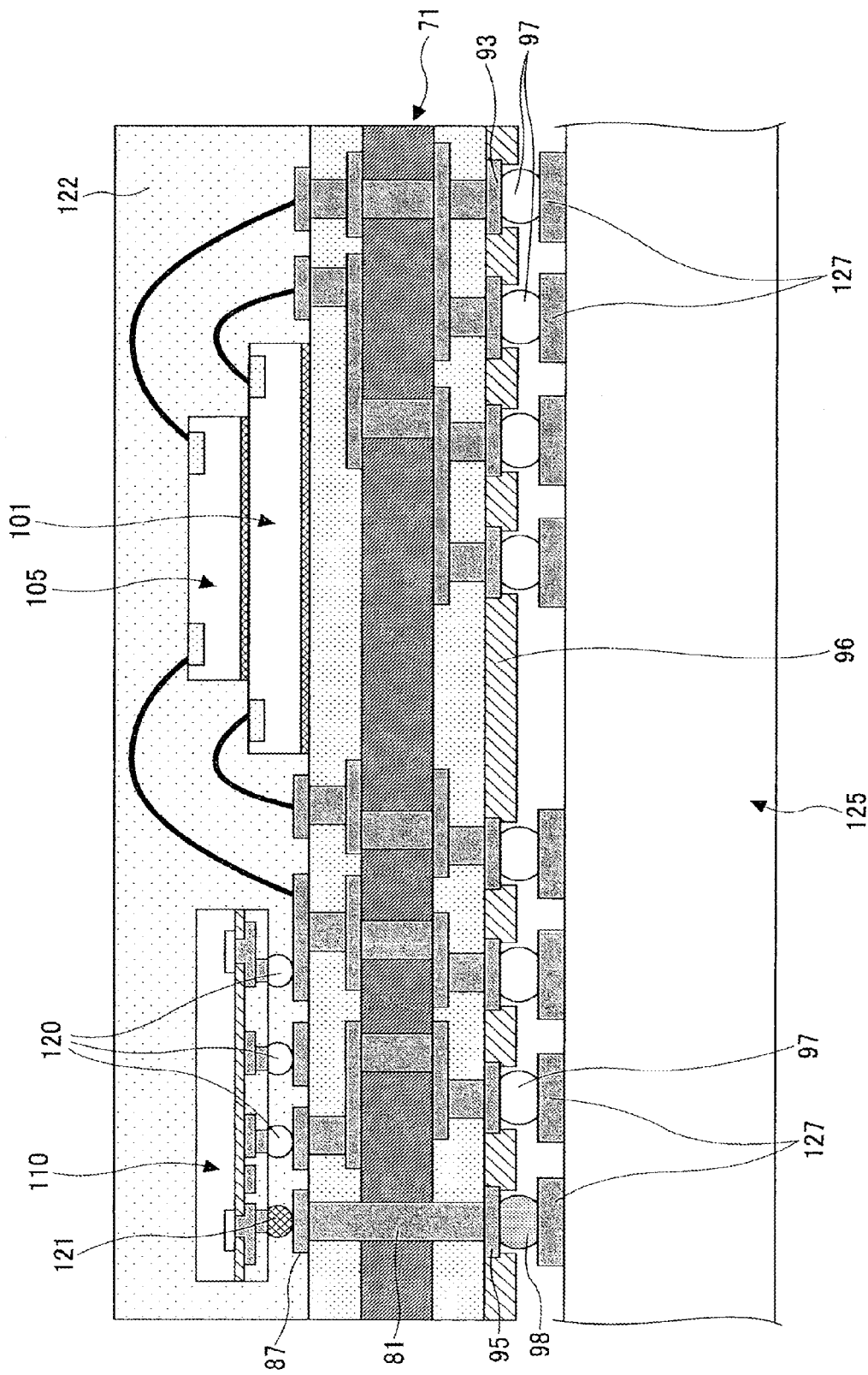
FIG. 3 is a cross-sectional diagram showing a state in which the semiconductor device of FIG. 2 is mounted on a mounting substrate.
Figure 4:
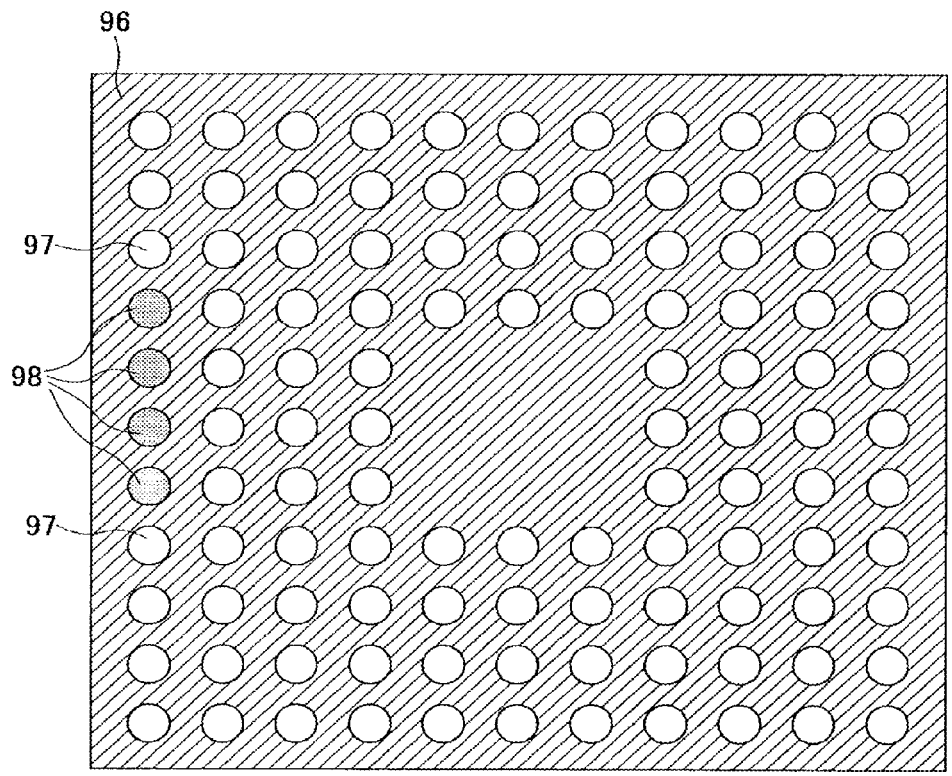
FIG. 4 is a plan view of the semiconductor device of FIG. 2 viewed from the bottom side.

First, referring to FIGS. 2-4, a semiconductor device 70 according to a first embodiment of the present invention is described.

FIG. 2 is a cross-sectional diagram showing a configuration of the semiconductor device 70 according to the first embodiment; and FIG. 3 is a cross-sectional diagram showing a state in which the semiconductor device 70 is mounted on a mounting substrate.

FIG. 4 is a bottom plan view of the semiconductor device 70 viewed from the direction indicated by arrow A of FIG. 2.

It is noted that in FIG. 2, a region B is shown that corresponds to a region of an upper insulating film 76 on which a semiconductor element 101 is mounted (referred to as 'chip mounting region B' hereinafter).

According to the present embodiment, the semiconductor device 70 includes a support substrate 71, external connection terminals 97 and 98, semiconductor elements 101 and 105 corresponding to a first semiconductor element, and a high frequency semiconductor element 110 corresponding to a second semiconductor element. The semiconductor elements 101 and 105 and the high frequency semiconductor element 110 are mounted on a common support substrate 71 and are integrally sealed by molded resin 122.

The molded resin 122 is arranged to protect the semiconductor elements 101, 105, and 110 and connection wires thereof. In the present embodiment, the semiconductor element 101 is mounted on the support substrate 71 via a bonding layer 104 through the so-called face-up mounting method, and the semiconductor element 105 is mounted on the semiconductor element 101 via a bonding layer 109 through face-up mounting.

The high frequency semiconductor element 110 corresponding to the second semiconductor element is mounted on the support substrate 71 through the so-called face-down (flip-chip) mounting method. In this case, a high frequency external connection terminal 121 of the semiconductor element 110 is connected to a connection pad 87 that is provided at a top end of a via hole 81 penetrating through the support substrate 71.

It is noted that in the present embodiment, the semiconductor element 101 is arranged to be larger in dimension than the semiconductor element 105. The semiconductor elements 101 and 105 may correspond to a memory element or a logic element (e.g., a microprocessor) that may be combined as is necessary or desired. Since the chip size and the number/arrangement of external connection terminals may vary depending on the functions and capacity of the semiconductor elements required in each electronic apparatus, the relative positioning of the memory element and the logic element may be determined according to each specific electronic apparatus (i.e., a determination as to which of a memory element or a logic element is to be placed on top of the other is made according to each specific electronic apparatus).

The high frequency semiconductor element 110 corresponds to a semiconductor element handling a high frequency signal such as a high frequency analog signal.

The support substrate 71 includes plural via holes 73 that penetrate through a base material 72 of the support substrate 71. On the upper surface (i.e., semiconductor mounting surface) of the support substrate 71, upper wiring 75 that is electrically connected to the via holes 73, an upper insulating layer 76 that covers the upper wiring 75, and upper via holes 78 that penetrate through the upper insulating layer 76 are provided. On the upper insulating layer 76, wire connecting portions 83 and 84 that are electrically connected to the upper via holes 78 are provided.

On the lower surface (i.e., external connection terminal mounting surface) of the support substrate 71, lower wiring 88 that is electrically connected to the via holes 73, a lower insulating layer 89 that covers the lower wiring 88, and lower via holes 91 that penetrate through the lower insulating layer 89 are provided. On the lower insulating layer 89, connection pads 93 that are electrically connected to the lower via holes 91 are provided. Also, a solder resist layer 96 is provided on the bottom surface regions of the lower insulating layer 89 corresponding to regions where the connection pads 93 are not provided.

Further, a via hole 81 that penetrates through the layered structure of the upper insulating film 76, the base material 72, and the lower insulating film 89 is provided in the present embodiment. The via hole 81 is arranged to realize connection with the high frequency external connection terminal 121 of the high frequency semiconductor element 110.

According to the present embodiment, the base material 72 corresponds to an insulating sheet/plate that is made of resin or ceramic material.

The upper wiring 75 is provided on an upper surface 72A of the base material 72 to be connected to the via holes 73, and the upper insulating layer 76 that is made of a resin layer is provided to cover the upper wiring 75.

The upper via holes 78 are connected to the upper wiring 75 at one end, and are connected to the wire connecting portions 83, 84, wiring 85, or connection pads 86 at the other end.

The via hole 81 is provided at a position corresponding to the position of the high frequency external connection terminal 121 of the high frequency semiconductor element 110.

At one side (upper side) of the support substrate 71, wire connecting portions 83 and 84 are provided on the upper insulating layer 76 to be electrically connected to the via holes 78. The wire connecting portions 83 are connected to electrode pads 102 of the semiconductor element 101 via wires 103. The wire connecting portion 84 is connected to an electrode pad 106 of the semiconductor element 105 via a wire 108.

The wiring 85 is provided on the upper insulating layer 76 to be electrically connected a corresponding via hole 78. An external connection terminal 120 of the high frequency semiconductor element 110 that is arranged to handle signals other than a high frequency signal is connected to the wiring 85. Also, an electrode pad 106 of the semiconductor element 105 is connected to the wiring 85 via a wire 108 so that electrical connection between the semiconductor element 105 and the high frequency semiconductor element 110 may be realized.

The connection pads 86 are provided on the upper insulating layer 76 at a portion of the element mounting surface where the high frequency semiconductor element 110 is face-down (flip-chip) mounted. The connection pads 86 are connected to external connection terminals 120 of the high frequency semiconductor element 110 that are arranged to handle signals other than a high frequency signal are connected to the connection pads 86 at one side. Also, the connection pads 86 are connected to the via holes 78 at the other side.

The connection pad 87 is provided on the upper insulating layer 76 to be connected to one end 81A of the via hole 81 at one side and be directly connected to the high frequency external connection terminal 121 of the face-down (flip-chip) mounted high frequency semiconductor element 110 at the other side.

At the other side (lower side) of the support substrate 71, the lower wiring 88 that is electrically connected to the via holes 73 and a lower insulating layer 89 made of resin that covers the lower wiring 88 are provided. The connection pads 93 provided on the bottom surface of the lower insulating layer 89 are electrically connected to the lower wiring 88 through lower via holes 91.

Also, it is noted that a connection pad 95 is provided at the bottom end of the via hole 81.

On the bottom surfaces of the connection pads 93 and 95, external connection terminals 97 and 98 corresponding to solder bumps are provided.

The solder resist layer 96 covering the bottom surface regions of the lower insulating layer 89 are provided around the connection pads 93 and 95 to prevent the external connection terminals 97 and 98 from coming into contact with one another.

As is shown in FIG. 3, the semiconductor device 70 having the structure as is described above is electrically connected to electrode pads/wiring 127 that are provided on a mounting substrate 125 via the external connection terminals 97 and 98. In this way, transmission of signals including high frequency signals may be realized between the semiconductor elements 101, 105, the high frequency semiconductor element 110, and the mounting substrate 125.

In the semiconductor device 70 according to the present embodiment, the semiconductor elements 101, 105, and the high frequency semiconductor element 110 are mounted on one common support substrate 71, and thereby, the length of the wiring 85 may be reduced so that the transmission loss of a high frequency signal being transmitted between the semiconductor element 105 and the high frequency semiconductor element 110 may be reduced.

Also, according to the present embodiment, the high frequency external connection terminal 121 of the high frequency semiconductor element 110 is connected to the connection pad 87, the connection pad 95 is connected to the connection pad 87 through the via hole 81, and the external connection terminal 98 that is provided on the connection pad 95 is connected to the electrode pad/wiring 127 of the mounting substrate 125. In this way, high frequency signal transmission (transmission of signals requiring high speed transmission) may be realized between the high frequency semiconductor element 110 and the mounting substrate 125.

As is shown in FIG. 4, according to the present embodiment, at the lower side of the support substrate 71 of the semiconductor device 70, the external connection terminals 97 and 98 are arranged into a matrix, and four external connection terminals 98 that are adapted to handle high frequency signals are arranged at the outermost positions of the external connection terminal arrangement so that the external connection terminals 98 may be easily connected to external circuits or apparatuses.

It is noted that the mounting pitch in the arrangement of the external connection terminals 97 and 98 is set to a predetermined value based on a standardized specification.

In the following, the structure of the high frequency semiconductor element 110 is described with reference to FIG. 5.

Figure 5:
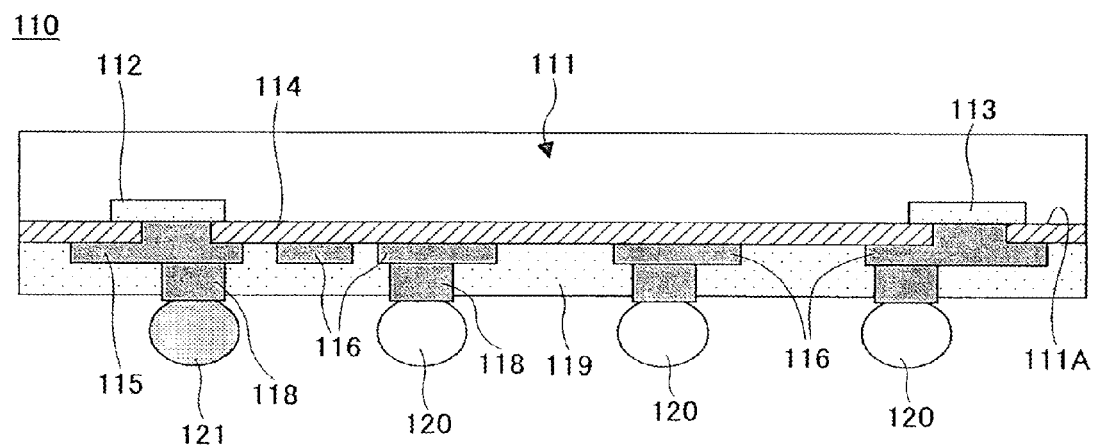
FIG. 5 is a cross-sectional diagram showing a configuration of a high frequency semiconductor element provided in the semiconductor device of FIG. 2.

FIG. 5 is a cross-sectional diagram showing a state in which the high frequency semiconductor element 110 is face-down (flip-chip) mounted on the support substrate 71 as is described above.

As is shown in this drawing, the high frequency semiconductor element 110 includes a high frequency element 111, re-wirings 115, 116, a column-shaped electrode (conductor post) 118, molded resin 119, external connection terminals 120, and a high frequency external connection terminal 121, for example.

The high frequency element 111 corresponds to a silicon (Si) semiconductor element that includes function elements realizing an electronic circuit that is adapted to handle high frequency analog signals, for example. The high frequency element 111 includes electrode pads 112 and 113 that are formed on one side of a silicon substrate through a conventional wafer process, and an insulating layer 114 covering the silicon substrate and exposing the electrode pads 112 and 113. It is noted the function elements such as transistors and resistors realizing the electronic circuit are not shown in the present drawing.

The electrode pad 112 corresponds to an electrode pad that is used for transmitting a high frequency signal. On the other hand, the electrode pad 113 corresponds to an electrode pad that is connected to a power line, a ground line, or wiring for handling relatively low frequency signals, for example.

The insulating layer 114 corresponds to a so-called passivation layer and may be made of a silicon nitride (SiN) film, for example.

The rewiring 115 extends along the insulating layer 114 and is connected to the electrode pad 112 at one end. At the other end, the rewiring 115 is electrically connected to the high frequency external connection terminal 121 via the column-shaped electrode (conductor post) 118.

The rewiring 116 extends along the insulating layer 114 and is connected to the electrode pad 113 at one end. At the other end, the rewiring 116 is electrically connected to the external connection terminal 120.

According to the present embodiment, the re-wirings 115 and 116 are made of copper (Cu), and are arranged to realize adjustment of the mounting positions of the high frequency external connection terminals 121 or the external connection terminals 120 and optimization of peripheral circuit elements (impedance matching).

Figure 6:
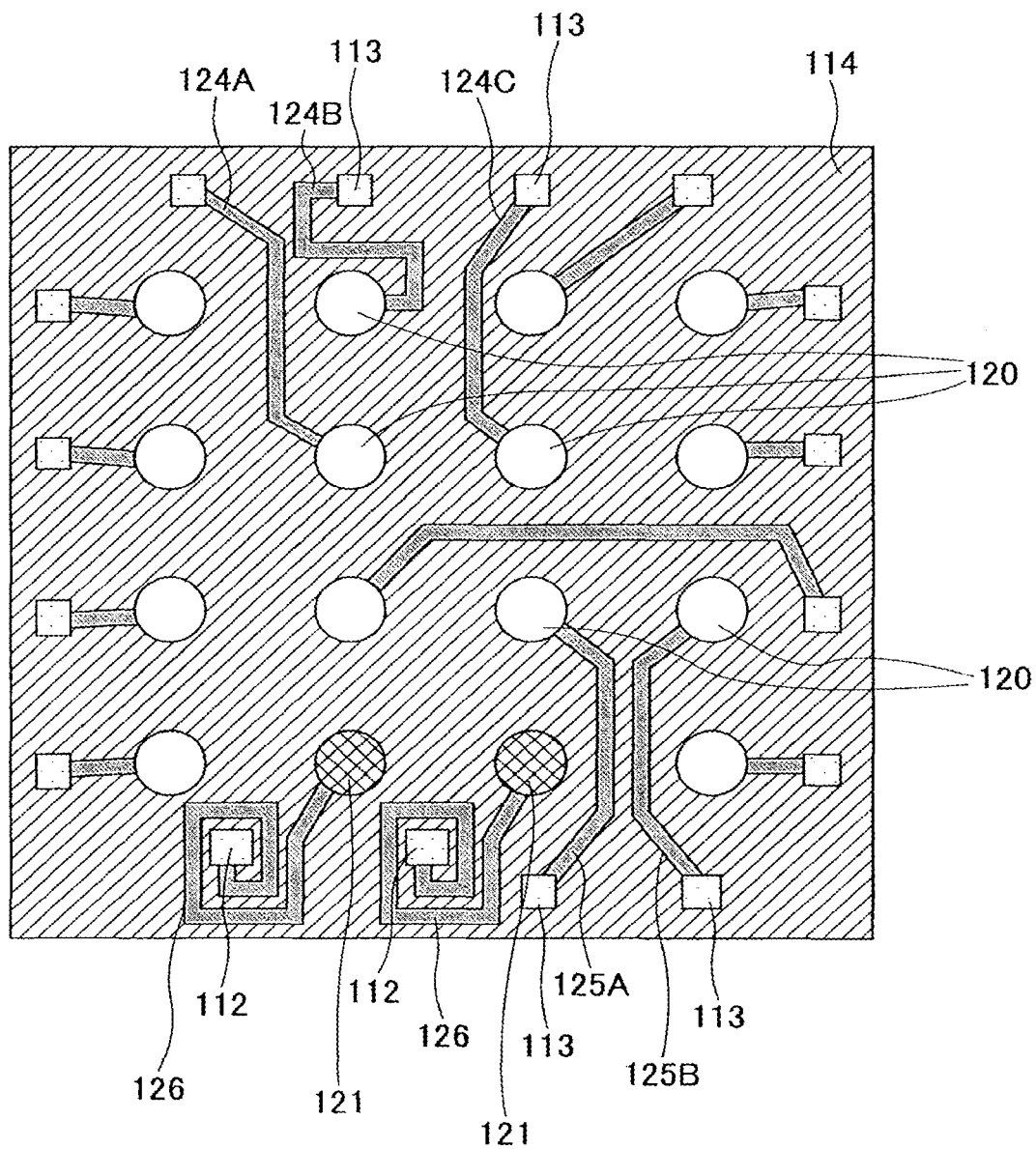
FIG. 6 is a diagram illustrating an exemplary arrangement of rewiring provided in a semiconductor element.

FIG. 6 is a diagram showing an exemplary arrangement of rewiring in a semiconductor element.

It is noted that the configuration of a semiconductor element that is shown in FIG. 6 does not necessarily correspond to the configuration of the high frequency semiconductor element 110 that is shown in FIG. 5. However, components shown in FIG. 6 that are identical to those shown in FIG. 5 are assigned the same references.

In the illustrated example of FIG. 6, re-wirings 124A, 124B, and 124C have substantially the same wiring length and make up one set of rewiring.

The re-wirings 124A, 124B, and 124C are connected to adjacent electrode pads 113 at one side, and are electrically connected to external connection terminals 120 via conductor posts (not shown) at the other side. It is noted that the rewiring 124B is arranged to extend along a circumventing path rather than taking the shortest path so that the rewiring 124B may have substantially the same wiring length as those of the re-wirings 124A and 124C.

By arranging adjacent electrode pads 113 to be connected to re-wirings 124A, 124B, and 124C having substantially the same wiring length, skew timing adjustment and optimization may be realized.

Also, in FIG. 6, rewiring 125A and 125B make up a pair of re-wirings including portions that are parallel with respect to each other.

The re-wirings 125A and 125B are connected to electrode pads 113 that are connected to a differential circuit unit of the electronic circuit at one side, and are electrically connected to external connection terminals 120 via conductor posts (not shown) at the other side. By arranging at least portions of a pair of re-wirings connected to a differential circuit unit to be parallel to each other, noise may be reduced.

Further, in FIG. 6, re-wring 126 is spirally arranged to surround the electrode pad 112 and realizes an inductor, which corresponds to a passive element.

The rewiring 126 is connected to the electrode pad 112 at one side, and is electrically connected to the high frequency external connection terminal 121 via a conductor post (not shown) at the other side.

By realizing an inductor using the rewiring 126, a passive element such as the inductor does not have to be separately provided, and the number of components and the mounting area may be reduced.

Also, by arranging the passive element to be positioned close to the electrodes of the semiconductor element, impedance may be reduced and the electric characteristics may be improved.

It is noted that in the high frequency semiconductor element 110 of FIG. 5, the re-wirings 115, 116 and the external connection terminals 120, 121 are electrically and mechanically connected to each other by column-shaped electrodes 118 that are provided on the re-wirings 115 and 116.

By providing the column-shaped electrodes 118 on the re-wirings 115 and 116 as is described above, the re-wirings 115 and 116 may be sealed by the molded resin 119. The molded resin 119 may be arranged to protect the re-wirings 115, 116, and the column-shaped electrodes 118, which may be made of copper (Cu), for example.

The external connection terminals 120 and 121 may correspond to bumps that are made of lead-free solder, for example.

Referring back to FIGS. 2 and 3, according to the present embodiment, when the high frequency semiconductor element 110 is face-down (flip-chip) mounted on the support substrate 71, the high frequency external connection terminal 121 is connected to the connection pad 87 that is provided at one end 81A of the via hole 81 penetrating through the support substrate 71.

In this way, the high frequency external connection terminal 121 of the high frequency semiconductor element 110 may be electrically connected to the external connection terminal 98 via the connection pad 87, the via hole 81, and the connection pad 95.

In such an arrangement, the connection distance may be reduced for realizing electrical connection between the high frequency external connection terminal 121 and the external connection terminal 98 via the via hole 81 so that transmission loss in transmitting a high frequency signal may be reduced.

Also, since neither the high frequency external connection terminal 121 nor the connection pad 87 are arranged to extend along the support substrate 71, the occurrence of mutual interference between the semiconductor element 101 and the semiconductor element 105 may be reduced.

It is noted that the mounting pitch in the arrangement of the external connection terminals 120 and the high frequency external connection terminals 121 is arranged to be set to a predetermined value based on a standardized specification.

In the following, the connection between the high frequency external connection terminal 121 and the connection pad 87 is described with reference to FIGS. 7-9.

Figure 7:
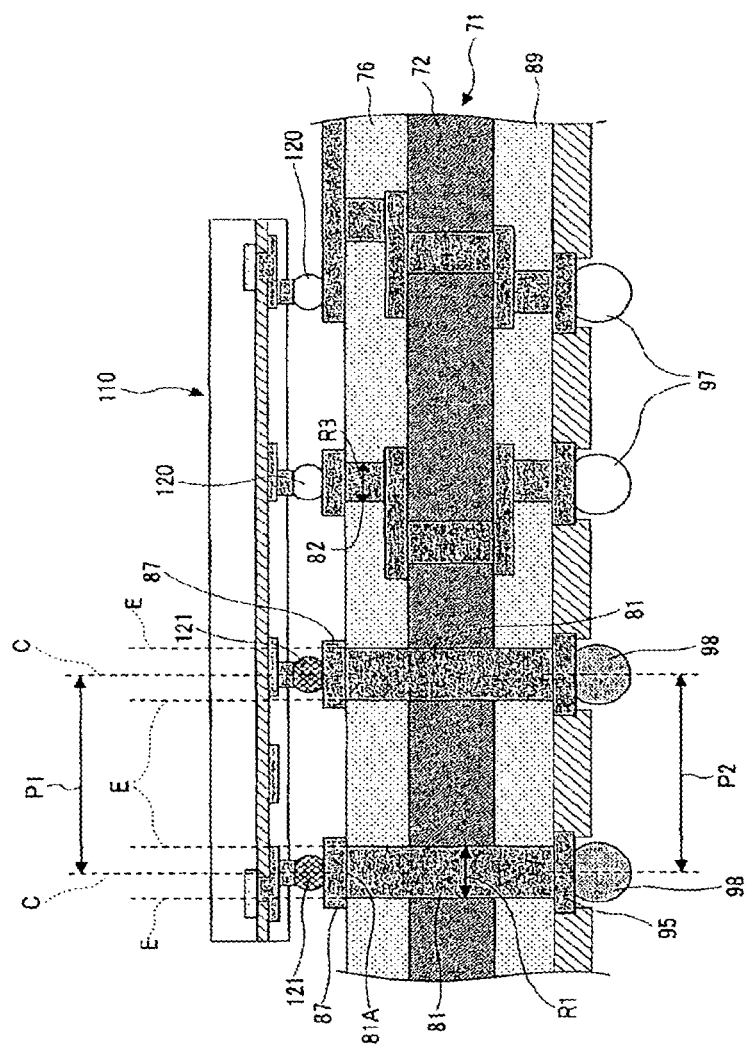
FIG. 7 is a diagram illustrating a connection of a high frequency external connection terminal of a high frequency semiconductor element in a case where the mounting pitch for external connection terminals of the high frequency semiconductor element and the mounting pitch for external connection terminals of a support substrate are equivalent.

First, referring to FIG. 7, a connection between the high frequency external connection terminal 121 and the connection pad 87 is described in a case where the mounting pitch P1 for the external connection terminals 120 and 121 of the high frequency semiconductor element 110 and the mounting pitch P2 for the external connection terminals 97 and 98 on the support substrate 71 are equal (i.e., P1=P2).

It is noted that in FIG. 7, the center axis of the high frequency external connection terminal 121 is represented by C (referred to as 'center axis C' hereinafter), the outer periphery of the via hole 81 is represented by E (referred to as 'periphery E' hereinafter), the mounting pitch for the external connection terminals 120 and 121 of the high frequency semiconductor element 110 is represented by P1 (referred to as 'mounting pitch P1' hereinafter), the mounting pitch for the external connection terminals 97 and 98 provided at the support substrate 71 is represented by P2 (referred to as 'mounting pitch P2' hereinafter), and the diameter of the via hole 81 is represented by R1 (referred to as 'diameter R1' hereinafter).

As is shown in FIG. 7, when P1=P2, the high frequency external connection terminal 121 of the high frequency semiconductor element 110 is placed at a position corresponding to the position of the end portion 81A of the via hole 81 via the connection pad 87 in a manner such that the center axis of the via hole substantially coincides with the center axis of the high frequency external connection terminal 121. The high frequency external connection terminal 121 positioned in this manner is then connected to the connection pad 87.

It is noted that in connecting the high frequency external connection terminal 121 to the connection pad 87, the center axis C of the high frequency external connection terminal 121 is preferably arranged to be positioned at the inner side of the periphery E of the via hole 81.

Figure 8:
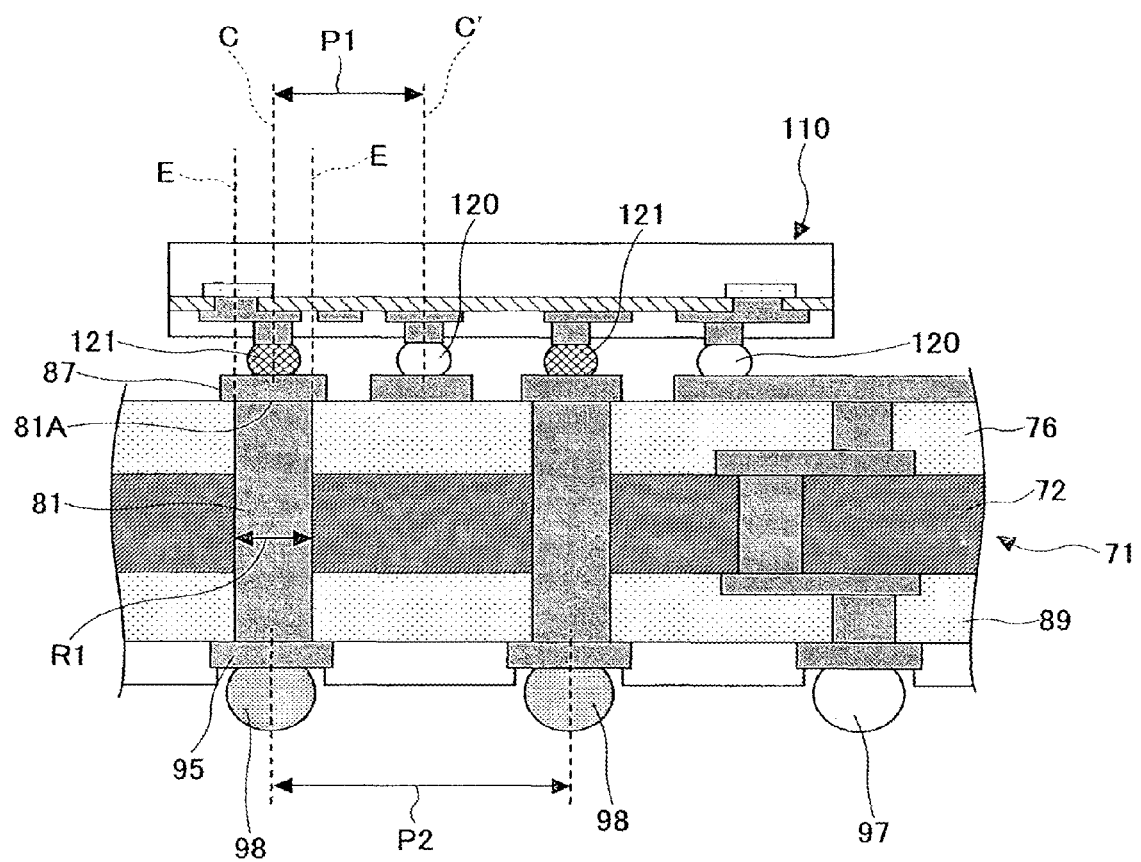
FIG. 8 is a diagram illustrating a connection of a high frequency external connection terminal of a high frequency semiconductor element in a case where the mounting pitch for the external connection terminals of the high frequency semiconductor element is half (½) the mounting pitch for the external connection terminals of the support substrate.
Figure 9:
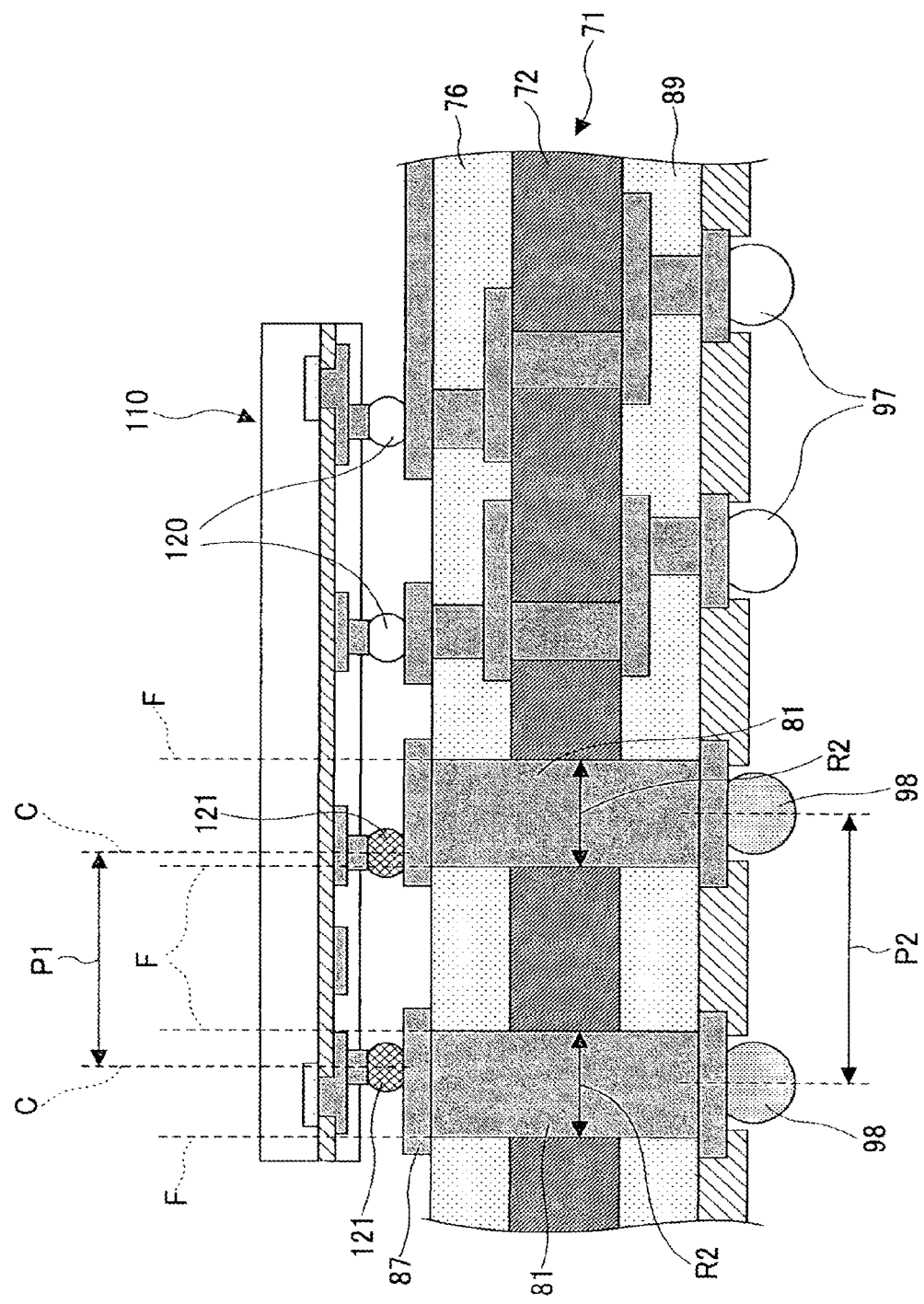
FIG. 9 is a diagram illustrating a connection of a high frequency external connection terminal of a high frequency semiconductor element in a case where the mounting pitch for the external connection terminals of the high frequency semiconductor element is k times (0<k<1) the mounting pitch for the external connection terminals of the support substrate.

Next, referring to FIGS. 8 and 9, exemplary connections between the high frequency external connection terminal 121 and the connection pad 87 are described in cases where the mounting pitch P1 for the external connection terminals 120 and 121 of the high frequency semiconductor element 110 and the mounting pitch P2 for the external connection terminals 97 and 98 provided on the support substrate 71 are different.

FIG. 8 illustrates the connection of the high frequency external connection terminal 121 in a case where the mounting pitch P1 for the external connection terminals 120 and 121 of the high frequency semiconductor element 110 is half (½) the mounting pitch P2 for the external connection terminals 97 and 98 provided on the support substrate 71. FIG. 9 illustrates the connection of the high frequency external connection terminal 121 in a case where the mounting pitch P1 for the external connection terminals 120 and 121 of the high frequency semiconductor element 110 is k times (0<k<1) the pitch P2 for the external connection terminals 97 and 98 provided on the support substrate 71.

It is noted that in FIGS. 8 and 9, components that are identical to those shown in FIG. 7 are given the same reference. In FIG. 8, the center axis of the external connection terminal 120 is represented by C'. In FIG. 9, the diameter of the via hole 81 is represented by 'R2' (referred to as 'diameter R2' hereinafter), and the outer periphery of the via hole 81 is represented by F (referred to as 'periphery F' hereinafter).

As is shown in FIG. 8, when P1=(P2/2), an external connection terminal 120 is provided between two high frequency external connection terminals 121 so that the distance between the high frequency external connection terminals 121 may be set to P1×2=P2, and the high frequency external connection terminal 121 may be arranged at a position corresponding to the position of the end portion 81A of the via hole 81 via the connection pad 87.

It is noted that in connecting the high frequency external connection terminal 121 to the connection pad 87, the center axis C of the high frequency external connection terminal 121 is preferably arranged to be positioned at the inner side of the periphery E of the via hole 81.

As is shown in FIG. 9, when P1=k×P2 (0<k<1), and the high frequency external connection terminal 121 cannot be connected at a position corresponding to the position of the end portion 81A of the via hole 81 when the diameter of the via hole 81 is set to R1, the diameter of the via hole 81 is widened to R2 (R2>R1) so as to enable the high frequency external connection terminal 121 to be arranged at a position corresponding to the position of the end portion 81A of the via hole 81. The high frequency external connection terminal 121 positioned in this manner is connected to the connection pad 87 that is provided on the end portion 81A of the via hole 81.

By widening the diameter of the via hole 81 provided at the support substrate 71, the high frequency external connection terminal 121 may be positioned to face the end portion 81A of the via hole 81 without having to change the mounting pitch P1 for the external connection terminals 120 and 121 of the high frequency semiconductor element 110.

In this way, accurate transmission of high frequency signals between the high frequency external connection terminal 121 and the external connection terminal 98 may be realized without inducing degradation of the high frequency characteristics of the high frequency semiconductor element 110.

It is noted that in connecting the high frequency external connection terminal 121 to the connection pad 87, the center axis C of the high frequency external connection terminal 121 is preferably arranged to be positioned at the inner side of the periphery F of the via hole 81.

By connecting the high frequency external connection terminal 121 to the connection pad 87 in a manner such that the center axis C of the high frequency external connection terminal 121 is positioned at the inner side of the periphery E/F of the via hole 81 as is described above, transmission loss of a high frequency signal being transmitted between the high frequency external connection terminal 121 and the external connection terminal 98 may be reduced.

Figure 10:
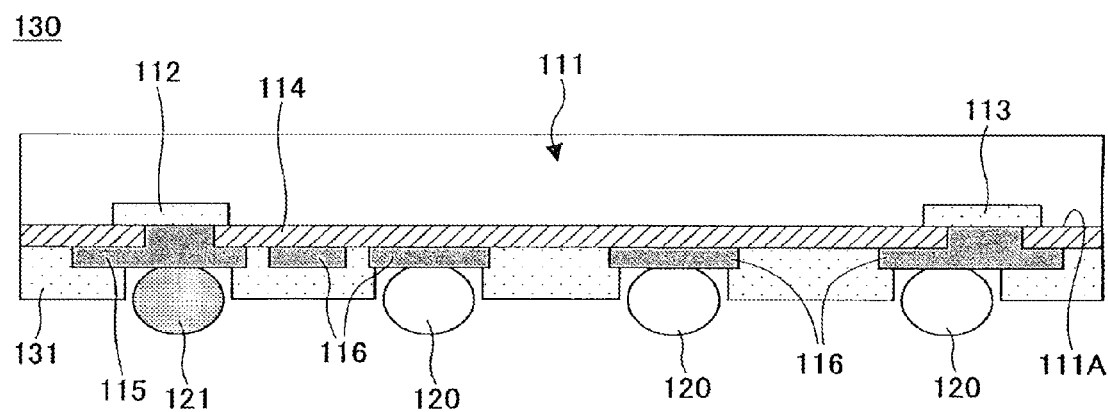
FIG. 10 is a cross-sectional diagram showing a configuration of a high frequency semiconductor element that does not include a conductor post.

FIG. 10 is a diagram showing a configuration of a high frequency semiconductor element 130 that does not include a column-shaped electrode (conductor post). It is noted that in this drawing, components that are identical to those shown in FIG. 5 are given the same references.

In the high frequency semiconductor element 130 of FIG. 10, the external connection terminals 120 and 121 are directly provided on the re-wirings 115 and 116 rather than providing the column-shaped electrode (conductor post). In the present example, resin 131 that is made of organic insulating resin, for example, is provided to cover the insulating layer 114.

As is described above, according to an embodiment, a semiconductor element that does not include a column-shaped electrode may be used as a high frequency semiconductor element.

It is noted that rewiring configurations such as the re-wirings 124A, 124B, 124C, 125A, 125B, and 126 shown in FIG. 6 may be provided in the high frequency semiconductor element 130 as is necessary or desired.

In the following, process steps for manufacturing the semiconductor device 70 are described.

First, suitable types of semiconductor elements are selected as the semiconductor elements 101, 105 and the high frequency semiconductor element 110 according to the functions required by the electronic apparatus employing the semiconductor device 70. For example, suitable semiconductor elements may be selected from a memory element and/or a logic element such as a microprocessor as the semiconductor elements 101 and 105, and a semiconductor element having a function for processing analog signals may be selected as the high frequency semiconductor element 110.

Also, the support substrate 71 is formed according to the structure of the electronic apparatus as well as the terminal structure/arrangement of the semiconductor elements. It is noted that at this point, the via hole 81 is formed on the support substrate 71 at a position corresponding to the mounting position of the high frequency external connection terminal 121 of the high frequency semiconductor element 110.

Then, on one side (upper surface) of the support substrate 71, the semiconductor elements 101, 105, and the high frequency semiconductor element 110 are mounted.

The semiconductor element 101 is bonded onto the support substrate 71 via the bonding layer 104 through face-up mounting, and the semiconductor element 105 is bonded onto the semiconductor element 101 via the bonding layer 109 through face-up mounting.

The high frequency semiconductor element 110 is mounted on the support substrate 71 through face-down (flip-chip) mounting. At this point, the high frequency external connection terminal 121 is arranged at a position corresponding to the position of the via hole 81, and is connected to the corresponding connection pad 87.

The electrode pads of the semiconductor elements 101 and 105 are electrically connected to electrode pads provided on the upper surface of the support substrate 71 via corresponding wires 103 and 108.

Then, the semiconductor elements 101, 105, and the high frequency semiconductor element 110 are sealed by the molded resin 122 along with the wires 103 and 108.

Then, the external connection terminals 97 and 98 are provided at the connection pads 93 formed on the other side (lower surface) of the support substrate 71.

By manufacturing the semiconductor device 70 according to the manufacturing method as is described above, high density packaging of the semiconductor elements on the support substrate may be facilitated compared to the conventional method, and optimization of the high frequency semiconductor element 110 may be facilitated in view of the time required for designing and manufacturing the semiconductor device as well as manufacturing costs.

Also, transmission loss of a high frequency signal being transmitted between the high frequency external connection terminal 121 and the external connection terminal 98 may be reduced.

(Second Embodiment)

In the following, a semiconductor device 135 according to a second embodiment of the present invention is described with reference to FIG. 11. It is noted that the semiconductor device 135 according to the present embodiment is characterized by implementing a shield member covering the high frequency semiconductor element.

Figure 11:
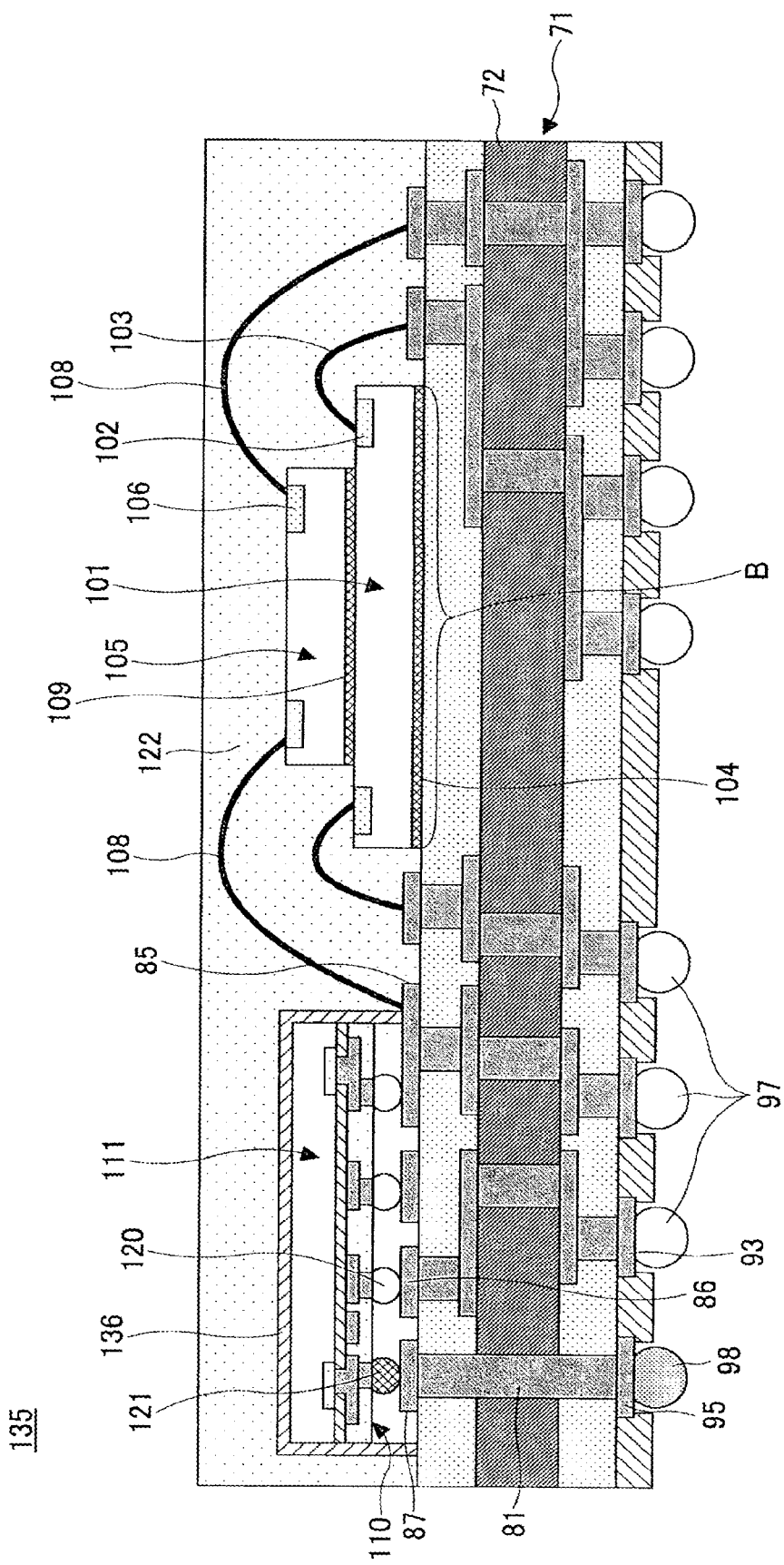
FIG. 11 is a cross-sectional diagram showing a configuration of a semiconductor device according to a second embodiment of the present invention.

In FIG. 11, components of the semiconductor device 135 that are identical to those of the semiconductor device 70 of the first embodiment are assigned the same references.

As is shown in FIG. 11, the semiconductor device 135 includes a support substrate 71, external connection terminals 97, 98, semiconductor elements 101, 105, a high frequency semiconductor element 110, and a shield member 136 covering the high frequency semiconductor element 110.

The semiconductor elements 101, 105, and the shield member 136 covering the high frequency semiconductor element 110 are covered by molded resin 122 along with wires 103 and 108.

In this example, the shield member 136 covering the high frequency semiconductor element 110 is electrically connected to a ground terminal (not shown) that is provided on the support substrate 71.

It is noted that aluminum (Al) or nickel brass (copper[Cu]-nickel[Ni]-zinc[Zn] alloy) may be used as the material of the shield member 136, for example.

By providing the shield member 136 covering the high frequency semiconductor element 110, mutual interference between the semiconductor elements 101, 105 and the high frequency semiconductor element 110 may be reduced or prevented.

(Third Embodiment)

In the following, a semiconductor device 140 according to a third embodiment of the present invention is described with reference to FIGS. 12 and 13.

Figure 12:
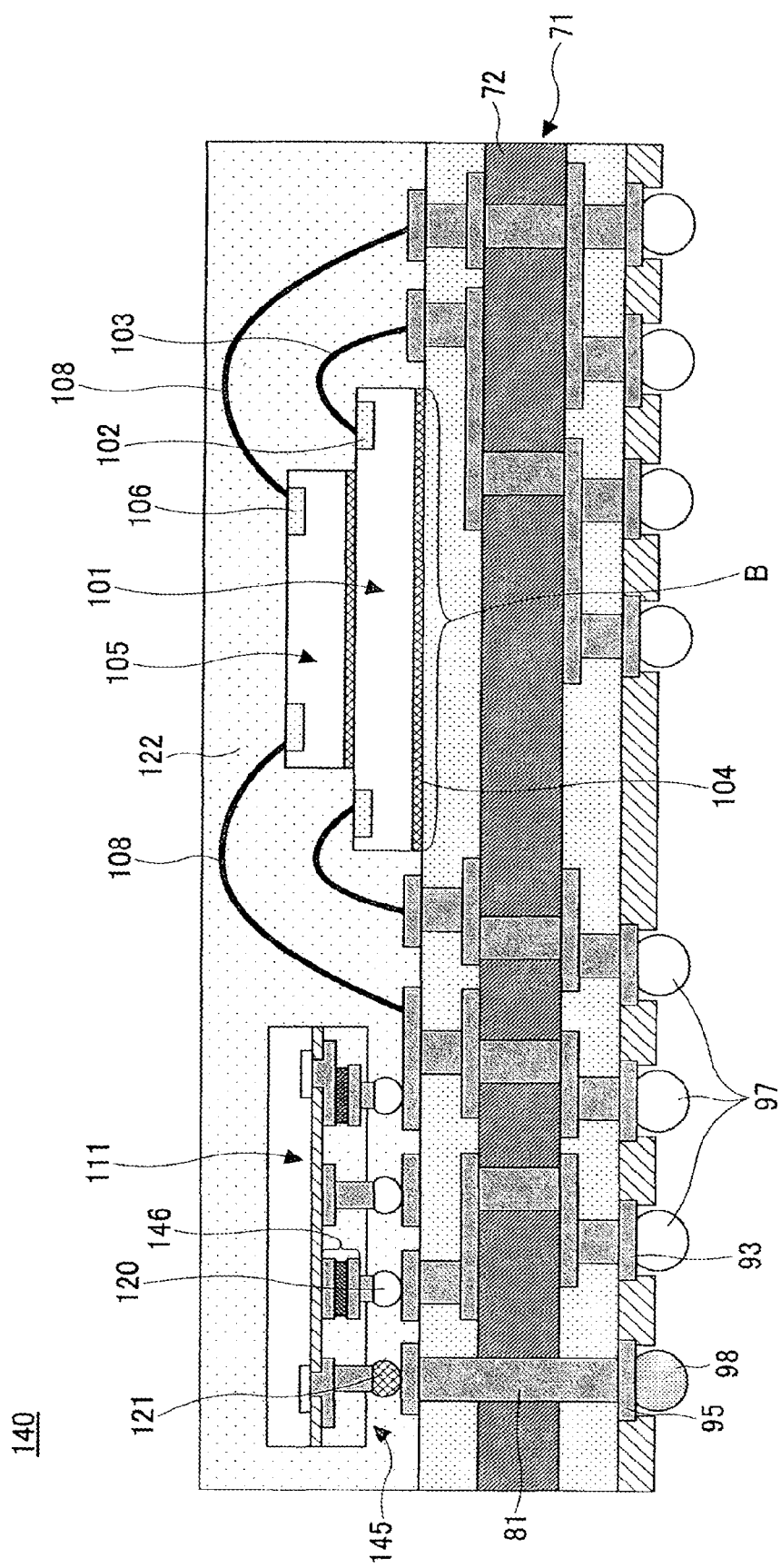
FIG. 12 is a cross-sectional diagram showing a configuration of a semiconductor device according to a third embodiment of the present invention.

FIG. 12 is a cross-sectional diagram showing a configuration of the semiconductor device 140 according to the present embodiment. FIG. 13 is an enlarged cross-sectional diagram showing a configuration of a high frequency semiconductor element 145 of the semiconductor device 140 of FIG. 12. It is noted that the semiconductor device 140 according to the present embodiment is characterized in that it includes a capacitor element that is mounted on a rewiring formation surface of the high frequency semiconductor element 145.

Figure 13:
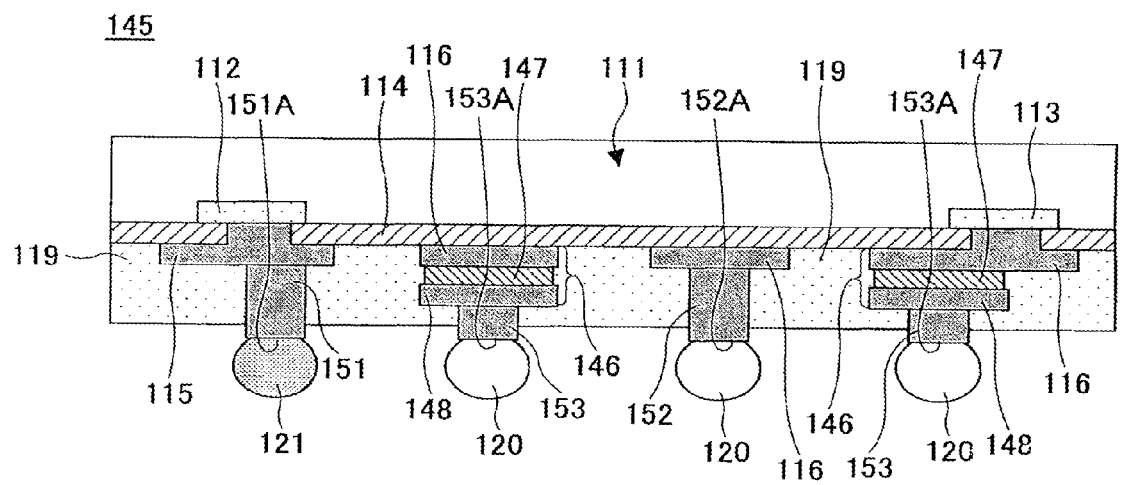
FIG. 13 is a cross-sectional diagram showing a configuration of a high frequency semiconductor element according to the third embodiment.

It is noted that in FIGS. 12 and 13, components that are identical to those of the semiconductor device according to the first and second embodiment are assigned the same references.

Referring to FIG. 12, the semiconductor device 140 according to the present embodiment includes a support substrate 71, external connection terminals 97, 98, semiconductor elements 101, 105, a high frequency semiconductor element 145, and molded resin 122 that is provided on one side of the support substrate 71 to cover the semiconductor elements 101, 105, and the high frequency semiconductor element 145.

Referring to FIG. 13, the high frequency semiconductor element 145 includes a high frequency element 111 with an insulating layer 114 formed on one side, re-wirings 115 and 116 that are provided on the insulating layer 114, column-shaped electrodes (conductor posts) 151~153 that are provided on the re-wirings 115, 116, and external connection terminals 120, 121 that are provided at tip portions of the column-shaped electrodes 151~153. Also, the high frequency semiconductor element 145 includes a capacitor element 146 that includes a dielectric layer 147 formed on the rewiring 116, and a rewiring layer 148 formed on the dielectric layer 147.

The re-wirings 115, 116, the capacitor element 146, and the column-shaped electrodes 151~153 are covered by molded resin 119.

It is noted that the re-wirings 115 and 116 may include the re-wirings 124A, 124B, 124C, 125A, 125B, and/or 126 described in FIG. 6 as is necessary or desired.

By providing a capacitor element 146 on the high frequency semiconductor element 145, for example, the rewiring 126 realizing an inductor and the capacitor element 146 may be combined to form a filter with relative ease so that high frequency characteristics of the high frequency semiconductor element 145 may be improved.

It is noted that the column-shaped electrode (conductor post) 151 is connected to the rewiring 115 of the high frequency element 111 at one end while its other end 151A is exposed from the molded resin 119, and the external connection terminal 121 is provided at this end portion 151A.

The column-shaped electrode 152 is connected to the rewiring 116 at one end while its other end 152A is exposed from the molded resin 119, and the external connection terminal 120 is provided at this end portion 152A.

The column-shaped electrode 153 is connected to the rewiring 148 at one end while its other end 153A is exposed from the molded resin 119, and the external connection terminal 120 is provided at this end portion 153A. It is noted that the end portions 151A-153A of the column-shaped electrodes 151~153 are arranged to be positioned on substantially the same plane.

By providing the column-shaped electrodes 151~153 on the re-wirings 115, 116, and 148, the rewiring 115 and the capacitor element 146 may be sealed by the molded resin 119 that may be molded through compression molding, for example. It is noted that the column-shaped electrodes 151~153 may be made of copper (Cu), for example.

Figure 14:
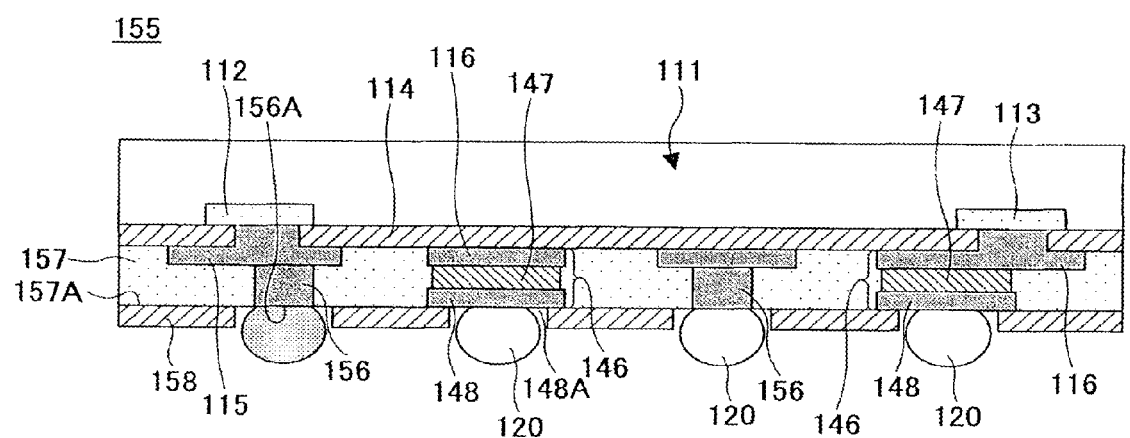
FIG. 14 is a cross-sectional diagram showing a configuration of a high frequency semiconductor element that does not include a conductor post.

FIG. 14 is a diagram showing a configuration of a high frequency semiconductor element 155 corresponding to a modified example of the high frequency semiconductor element 145 of FIG. 13.

It is noted that the high frequency semiconductor element 155 according to the present example does not include a column-shaped electrode (conductor post). In FIG. 14, components that are identical to those shown in FIG. 13 are assigned the same references.

The high frequency semiconductor element 155 of FIG. 14 includes a semiconductor element 111 with an insulating layer 114 formed on one side, re-wirings 115 and 116 provided on the insulating layer 114, via holes 156 provided on the re-wirings 115 and 116, and external connection terminals provided at one side of the via holes 156.

Also, the high frequency semiconductor element 155 includes a capacitor element 146 that is realized by a dielectric layer 147 provided on the re-wirings 115 and 116, and a rewiring layer 148 provided on the dielectric layer 147. In the present example, the external connection terminal 120 is directly provided on the rewiring layer 148 realizing one electrode of the capacitor element 146.

The re-wirings 115, 116, the capacitor element 146, and the via hole 156 are covered by molded resin 157, and an insulating layer 158 such as a solder resist layer is provided on a surface of the molded resin 157 to protect surface portions of the rewiring 148.

It is noted that the re-wirings 115 and 116 may include the re-wirings 124A, 124B, 124C, 125A, 125B, and/or 126 of FIG. 6 as is necessary or desired.

According to an embodiment, the high frequency semiconductor element 155 as is described above may be used in the semiconductor device 140 in place of the high frequency semiconductor element 145 to realize one or more effects and advantages of the present invention.

(Fourth Embodiment)

In the following, a semiconductor device 160 according to a fourth embodiment of the present invention is described with reference to FIGS. 15 and 16.

Figure 15:
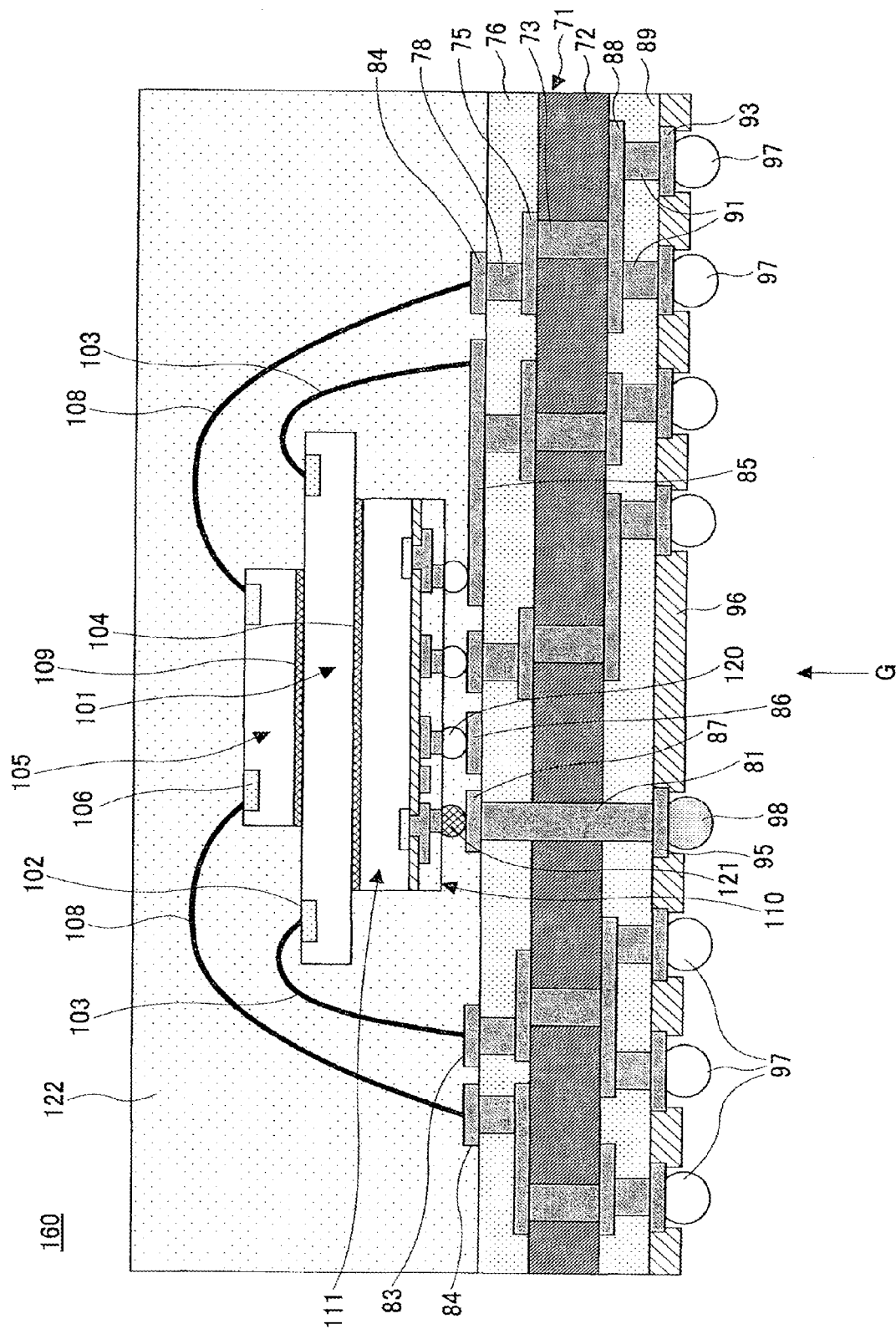
FIG. 15 is a cross-sectional diagram showing a configuration of a semiconductor device according to a fourth embodiment of the present invention.

FIG. 15 is a cross-sectional diagram showing a configuration of the semiconductor device 160 according to the present embodiment. FIG. 16 is a plan view of a support substrate 71 of the semiconductor device 160 viewed from the bottom side (from the direction indicated by arrow G in FIG. 15).

The semiconductor device 160 according to the present embodiment is characterized in that plural semiconductor elements including a high frequency semiconductor element are arranged into a layered (stacked) structure to be mounted on one side of the support substrate 71.

Figure 16:
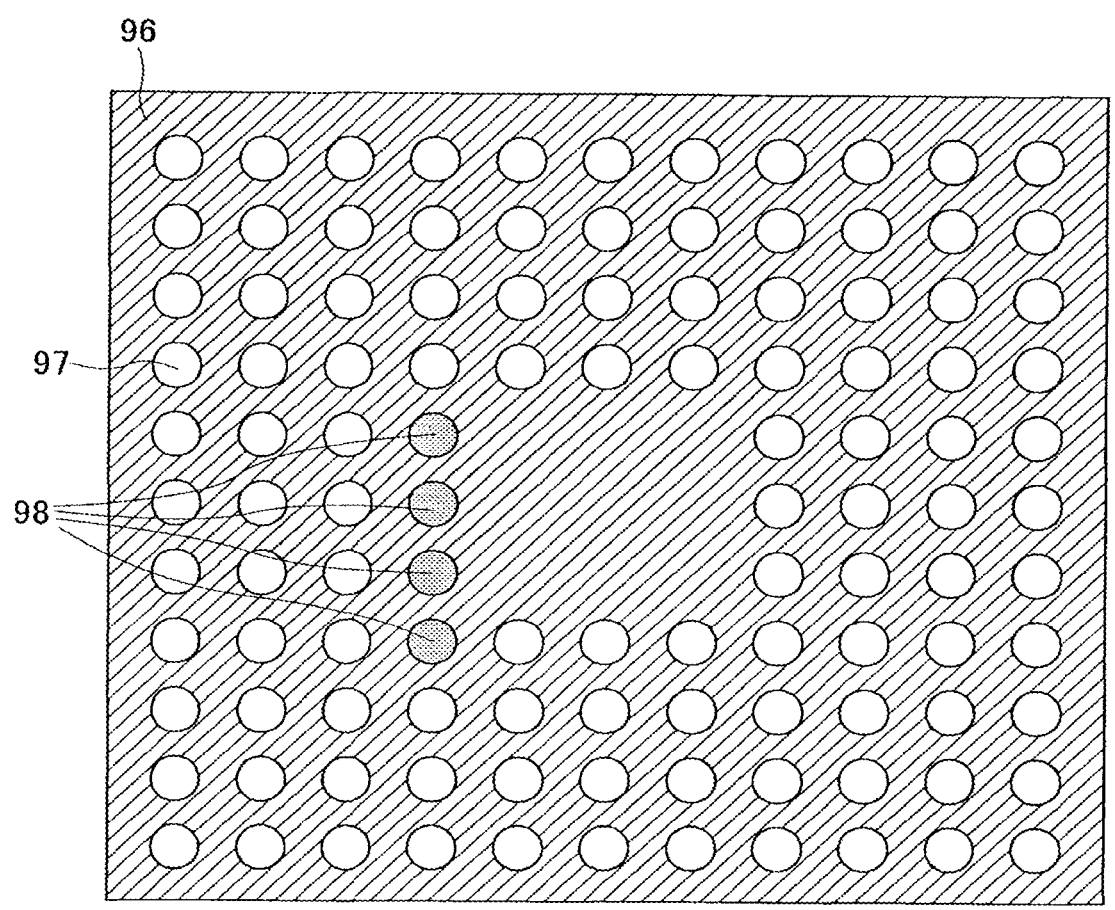
FIG. 16 is a plan view of the semiconductor device of FIG. 15 viewed from the bottom side.

It is noted that in FIGS. 15 and 16, components that are identical to those of the semiconductor devices of the previously described embodiments are assigned the same references.

In the present example, the support substrate 71 of the semiconductor device 160 includes a base material 72, and plural via holes 73 that penetrate through the base material 72. On one side (upper surface) of the base material 72 corresponding to the semiconductor element mounting surface, upper wiring 75 that is electrically connected to the via holes 73, an upper insulating layer 76 that covers the upper wiring 75, and upper via holes 78 that penetrate through the upper insulating layer 76 are provided. Further, wire connecting portions 83, 84, and wirings 85, 86 that are electrically connected to the via holes 78 are provided on the upper insulating layer 76.

On the other side (lower surface) of the base material 72 corresponding to the external connection terminal mounting surface, lower wiring 88 that is electrically connected to the via holes 73, a lower insulating layer 89 covering the lower wiring 88, lower via holes 91 penetrating through the lower insulating layer 89, and connection pads that are electrically connected to the lower via holes 91 are provided. Also, a solder resist layer 96 that is arranged to surround the connection pads 93 is provided on the lower insulating layer 89.

Also, a via hole 81 penetrating through a layered structure including the base material 72, the upper insulating layer 76, and the lower insulating layer 89 is provided at a position corresponding to the mounting position of a high frequency semiconductor element 110.

According to the present embodiment, the high frequency semiconductor element 110 is face-down mounted on one side (upper surface) of the support substrate 71 around a center portion thereof, and the external connection terminals 120 and 121 are directly connected to the wiring 85 and connection pads 87.

Also, a semiconductor element 101 is mounted on the upper surface of the high frequency semiconductor element 110 via a bonding layer 104, and a semiconductor element 105 is mounted on the upper surface of the semiconductor element 101 via a bonding layer 109. In this way, plural semiconductor elements 110, 101, and 105 are arranged into a layered (stacked) structure to be mounted on the support substrate 71.

It is noted that by arranging the center axis of a high frequency external connection terminal 121 to be positioned within the diameter (periphery) of the via hole 81 or the area occupied by the via hole 81 upon connecting the high frequency external connection terminal to a corresponding connection pad 87, the length of the transmission path for transmitting a high frequency signal may be reduced, and transmission loss of the high frequency signal being transmitted between the high frequency external connection terminal 121 and an external connection terminal 98 may be reduced.

Also, in the present example, electrode pads 102 of the semiconductor element 101 are electrically connected to the wire connecting portions 83 and the wiring 85 that are provided on the support substrate via wires 103. Electrode pads 106 of the semiconductor element 105 are electrically connected to the wire connecting portions 84 provided on the support substrate 71 via wires 108.

It is noted that the wire connection portions 83 and the wiring 85 are positioned inward with respect to the wire connecting portions 84 in order to facilitate wire connection of the semiconductor elements 101 and 105.

The semiconductor elements 101, 105, and the high frequency semiconductor element 110 provided on one side of the support substrate 71 are sealed by molded resin 122 along with the wires 103 and 108.

By stacking the semiconductor elements 101 and 105 onto the high frequency semiconductor element 110, and mounting the stacked semiconductor elements onto the support substrate 71, dimensions of the support substrate 71 may be reduced so that miniaturization of the semiconductor device 160 may be realized.

It is noted that in one embodiment, the high frequency semiconductor element 130 of FIG. 10 may be used instead of the high frequency semiconductor element 110 in the semiconductor device 160.

Also, it is noted that the high frequency semiconductor element 145 or 155 including a capacitor element 146 may be used in the semiconductor device 160 as is necessary or desired. By using the high frequency semiconductor element 145 or 155 including a capacitor element 146, for example, an inductor that is realized by the rewiring 126 and the capacitor element 146 may be combined to realize a filter with relative ease so that high frequency characteristics of the semiconductor device 160 may be improved.

(Fifth Embodiment)

Figure 17:
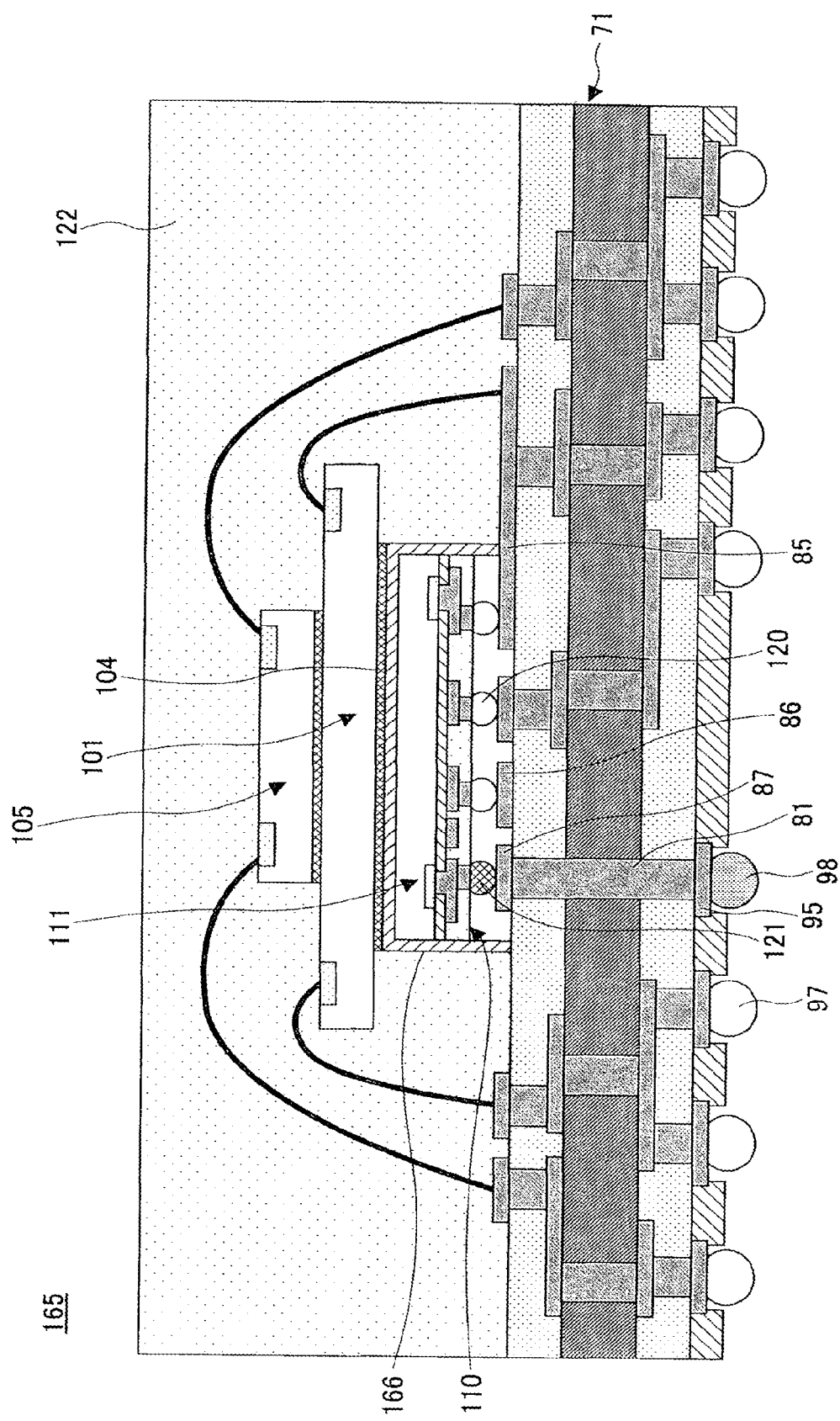
FIG. 17 is a cross-sectional diagram showing a configuration of a semiconductor device according to a fifth embodiment of the present invention.

In the following, a semiconductor device 165 according to a fifth embodiment of the present invention is described with reference to FIG. 17.

The semiconductor device 165 according to the present embodiment is characterized by including a shield member 166 that covers a high frequency element 111 of a high frequency semiconductor element 110. It is noted that in FIG. 17, components that are identical to those shown in FIG. 15 are assigned the same references.

In the semiconductor device 165 according to the present embodiment, the high frequency element 111, which is face-down (flip-chip) mounted and electrically connected to wirings 85, 86, and connection pads 87 via electrodes 120 and 121, is covered by the shield member 166, and the semiconductor element 101 is mounted on the shield member 166.

According to the present embodiment, the shield member 166 covers the high frequency element 111, and is electrically connected to a ground terminal (not shown) provided at the support substrate 71. It is noted that aluminum (Al) or nickel brass (i.e., copper [Cu]-nickel [Ni]-zinc [Zn] alloy) may be used as the material of the shield member 166, for example, as in the second embodiment of the present invention.

By providing the shield member 166 covering the high frequency element 111, mutual interference between the semiconductor elements 101, 105 and the high frequency element 111 may be reduced or prevented.

It is noted that the present invention is not limited to the specific embodiments described above, and variations and modifications may be made without departing from the scope of the present invention.

For example, in the embodiments described above, the via hole that is provide for the high frequency electrode (high frequency external connection terminal) of the high frequency semiconductor element is arranged into one via hole that extends from one side of the support substrate to the other side of the support substrate. However, the present invention is not limited to such an arrangement, and other embodiments are possible in which the via hole for the high frequency electrode is divided into sections in lengthwise directions, that is, in the depth directions of the support substrate, and electrical connection is realized via a wiring layer or an electrode pad provided between the divided sections, for example. In this case, positional deviation may occur in perpendicular directions with respect to the lengthwise directions of the via hole. Herein, influence on transmission of a high frequency signal may decrease in proportion to a decrease in the positional deviation between the via hole sections (i.e., when the area of the mutually matching portions of the via holes is increased).

The present application is based on and claims the benefit of the earlier filing date of Japanese Patent Application No. 2005-042872 filed on Feb. 18, 2005, the entire contents of which are hereby incorporated by reference.

What is claimed is:

1. A semiconductor device comprising:
a substrate;
a via hole that penetrates through the substrate;
a second semiconductor element that is mounted on one side of the substrate;
a first electrode that faces the one side of the substrate and is connected to the via hole, the first electrode provided on a surface of the second semiconductor element;
a first semiconductor element that is stacked above the second semiconductor element;
a second electrode that is provided on the other side of the substrate and electrically connects to the first electrode with the via hole;
wherein the first electrode is positioned on a periphery of the second semiconductor element in a plan view;
the first electrode has a first center axis;
the via hole has a second center axis that is located at a position different from the first center axis in a plan view;
a diameter of the via hole is larger than a diameter of the first electrode; and
the first semiconductor element and the second semiconductor element are integrally sealed by molded resin.

2. The semiconductor device as claimed in claim 1, wherein the second semiconductor element is electrically connected to the first semiconductor element via a third electrode of the second semiconductor element.

3. The semiconductor device as claimed in claim 1, wherein the first center axis is positioned within the diameter of the via hole or an area occupied by the via hole in a plan view.

4. The semiconductor device as claimed in claim 1, further comprising a third semiconductor element that is stacked above the first semiconductor element.

5. The semiconductor device as claimed in claim 1, wherein:
a plurality of the first electrodes are arranged with a first pitch; and
a plurality of the via holes are arranged with a second pitch that is larger than the first pitch.

6. The semiconductor device as claimed in claim 1, further comprising:
a third electrode provided on the first semiconductor element;
a wire connecting portion provided on the one side of the substrate;
a wire connected to the third electrode and the wire connecting portion;
a fourth electrode that is electrically connected to the wire connecting portion, the fourth electrode provided on the other side of the substrate;
an upper via hole that is connected to the wire connecting portion, the upper via hole provided in the substrate; and
a lower via hole that is connected to the fourth electrode.

7. The semiconductor device as claimed in claim 6, wherein the fourth electrode is located nearer to an edge of the substrate than the second electrode.

* * * * *